(12) United States Patent
Chu et al.

(10) Patent No.: US 11,508,736 B2
(45) Date of Patent: Nov. 22, 2022

(54) METHOD FOR FORMING DIFFERENT TYPES OF DEVICES

(71) Applicant: Taiwan Semiconductor Manufacturing Co., Ltd., Hsin-Chu (TW)

(72) Inventors: Feng-Ching Chu, Hsinchu (TW); Wei-Yang Lee, Taipei (TW); Feng-Cheng Yang, Hsinchu (TW); Yen-Ming Chen, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/895,678

(22) Filed: Jun. 8, 2020

(65) Prior Publication Data

US 2021/0384198 A1 Dec. 9, 2021

(51) Int. Cl.
| | |
|---|---|
| *H01L 27/11* | (2006.01) |
| *H01L 29/423* | (2006.01) |
| *H01L 29/10* | (2006.01) |
| *H01L 29/08* | (2006.01) |
| *H01L 21/02* | (2006.01) |
| *H01L 29/66* | (2006.01) |
| *H01L 21/306* | (2006.01) |
| *H01L 21/3105* | (2006.01) |
| *H01L 29/78* | (2006.01) |
| *H01L 29/06* | (2006.01) |

(52) U.S. Cl.
CPC .... *H01L 27/1104* (2013.01); *H01L 21/02532* (2013.01); *H01L 21/30604* (2013.01); *H01L 21/31053* (2013.01); *H01L 27/1116* (2013.01); *H01L 29/0673* (2013.01); *H01L 29/0847* (2013.01); *H01L 29/1037* (2013.01); *H01L 29/42392* (2013.01); *H01L 29/6653* (2013.01); *H01L 29/6656* (2013.01); *H01L 29/66545* (2013.01); *H01L 29/66553* (2013.01); *H01L 29/66636* (2013.01); *H01L 29/66795* (2013.01); *H01L 29/785* (2013.01)

(58) Field of Classification Search
CPC ............. H01L 27/1104; H01L 27/1116; H01L 27/0092; H01L 21/02532; H01L 21/30604; H01L 21/31053; H01L 29/0673; H01L 29/0847; H01L 29/1037; H01L 29/42392; H01L 29/6653; H01L 29/66545; H01L 29/66553; H01L 29/6656; H01L 29/66636; H01L 29/66795; H01L 29/785
USPC ........................................ 257/368, 369, 401
See application file for complete search history.

(56) References Cited

U.S. PATENT DOCUMENTS

| | | |
|---|---|---|
| 9,818,872 B2 | 11/2017 | Ching et al. |
| 9,887,269 B2 | 2/2018 | Ching et al. |

(Continued)

*Primary Examiner* — Dao H Nguyen
(74) *Attorney, Agent, or Firm* — Haynes and Boone, LLP

(57) ABSTRACT

A semiconductor device according to the present disclosure includes a gate-all-around (GAA) transistor in a first device area and a fin-type field effect transistor (FinFET) in a second device area. The GAA transistor includes a plurality of vertically stacked channel members and a first gate structure over and around the plurality of vertically stacked channel members. The FinFET includes a fin-shaped channel member and a second gate structure over the fin-shaped channel member. The fin-shaped channel member includes semiconductor layers interleaved by sacrificial layers.

20 Claims, 17 Drawing Sheets

(56) References Cited

U.S. PATENT DOCUMENTS

| | | | |
|---|---|---|---|
| 9,899,398 B1 | 2/2018 | Colinge et al. | |
| 10,032,627 B2 | 7/2018 | Lee et al. | |
| 10,109,721 B2 | 10/2018 | Lin et al. | |
| 10,157,799 B2 | 12/2018 | Ching et al. | |
| 10,199,502 B2* | 2/2019 | Huang | H01L 29/41791 |
| 10,290,546 B2 | 5/2019 | Chiang et al. | |
| 10,475,902 B2 | 11/2019 | Lee et al. | |
| 2017/0373163 A1* | 12/2017 | Vellianitis | H01L 29/78696 |
| 2018/0006139 A1* | 1/2018 | Seo | H01L 29/66795 |
| 2018/0175036 A1 | 6/2018 | Ching et al. | |
| 2020/0381427 A1* | 12/2020 | Suh | H01L 29/1054 |

\* cited by examiner

METHOD FOR FORMING DIFFERENT TYPES OF DEVICES

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down ha s also increased the complexity of processing and manufacturing ICs.

For example, as integrated circuit (IC) technologies progress towards smaller technology nodes, multi-gate devices have been introduced to improve gate control by increasing gate-channel coupling, reducing off-state current, and reducing short-channel effects (SCEs). A multi-gate device generally refers to a device having a gate structure, or portion thereof, disposed over more than one side of a channel region. Fin-type field effect transistors (FinFETs) and gate-all-around (GAA) transistors (both also referred to as non-planar transistors) are examples of multi-gate devices that have become popular and promising candidates for high performance and low leakage applications. A FinFET has an elevated channel wrapped by a gate on more than one side (for example, the gate wraps a top and sidewalls of a "fin" of semiconductor material extending from a substrate). Compared to planar transistors, such configuration provides better control of the channel and drastically reduces SCEs (in particular, by reducing sub-threshold leakage (i.e., coupling between a source and a drain of the FinFET in the "off" state)). A GAA transistor has a gate structure that can extend, partially or fully, around a channel region to provide access to the channel region on two or more sides. The channel region of the GAA transistor may be formed from nanowires, nanosheets, other nanostructures, and/or other suitable structures. In some implementations, such channel region includes multiple nanostructures (which extend horizontally, thereby providing horizontally-oriented channels) that are vertically stacked. Such GAA transistor can be referred to as a vertically-stacked horizontal GAA (VGAA) transistor.

GAA transistors and FinFETs may be fabricated on the same substrate to take advantages of benefits of both types of multi-gate devices. Conventionally, because fabrication of GAA transistors and fabrication of FinFETs require different epitaxial layer arrangements and involve different process steps, it may be challenging or costly to fabricate GAA transistors and FinFETs on the same substrate. Therefore, although conventional devices and methods have been generally adequate for their intended purposes, they are not satisfactory in every respect.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
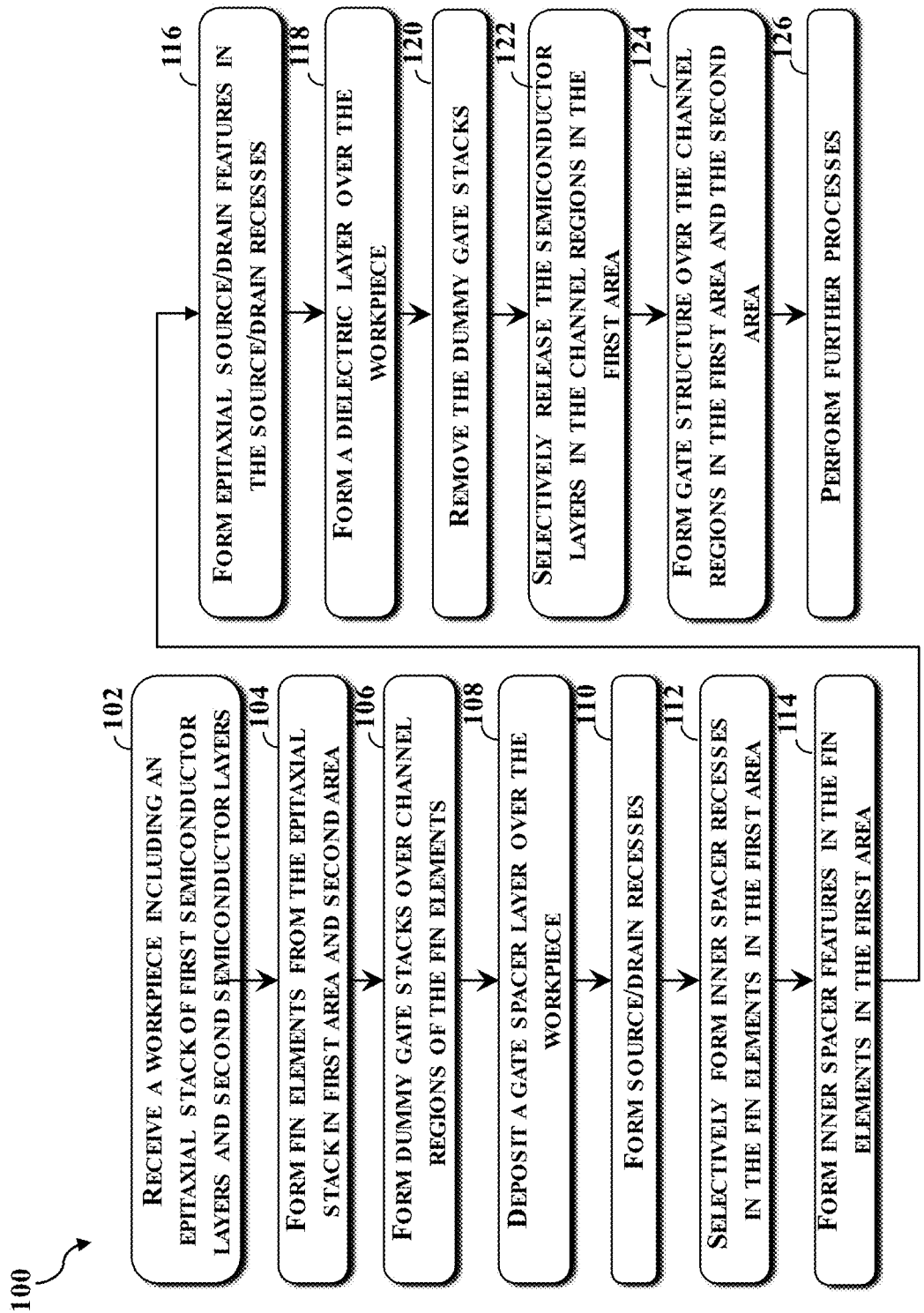
FIG. 1 illustrates a flow chart of a method for forming a semiconductor device having multiple device areas, according to one or more aspects of the present disclosure.

The following disclosure provides many different embodiments, or examples, for implementing different features of the provided subject matter. Specific example s of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second feature s may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term is intended to encompass numbers that are within +/−10% of the number described, unless otherwise specified. For example, the term "about 5 nm" encompasses the dimension range from 4.5 nm to 5.5 nm.

The present disclosure is generally related to multi-gate transistors and fabrication methods, and more particularly to fabrication of gate-all-around (GAA) transistors and fin-type field effect transistors (FinFETs) in different device regions of a semiconductor device.

Multi-gate transistors include those transistors whose gate structures are formed on at least two-sides of a channel region. These multi-gate devices may include a p-type metal-oxide-semiconductor device or an n-type metal-oxide-semiconductor device. Examples of multi-gate transistors include FinFETs, on account of their fin-shaped structure and gate-all-around (GAA) devices. A GAA device includes any device that has its gate structure, or portion thereof, formed on 4-sides of a channel region (e.g., surrounding a portion of a channel region). Embodiments of the present disclosure may have channel regions disposed in nanowire channel(s), bar-shaped channel(s), nanosheet channel(s), nanostructure channel(s), column-shaped channel(s), post-shaped channel(s), and/or other suitable channel configurations. Devices according to the present disclosure may have one or more channel regions (e.g., nanowires, nanosheets, nanostructures) associated with a single, contiguous gate structure. However, one of ordinary skill would recognize that the teachings in the present disclosure may be applicable to a single channel (e.g., single nanowire, single nanosheet, single nanostructure) or any number of channels. One of ordinary skill in art may recognize other examples of semiconductor devices that may benefit from aspects of the present disclosure.

As scales of the fin width in FinFETs decreases, channel width variations could cause undesirable variability and mobility loss. GAA transistors are being studied as an alternative to FinFETs. In a GAA transistor, the gate of the transistor is made all around the channel such that the channel is surrounded or wrapped by the gate. Such a transistor has the advantage of improving the electrostatic control of the channel by the gate, which also mitigates leakage currents. While GAA transistors have advantages over FinFETs, the reduced dimensions of channel members of GAA transistors make them less suitable for high current applications. For that and other reasons, it may be desirable to fabricate GAA transistors and FinFETs on the same substrate to take advantages of different properties of the GAA transistors and FinFETs. In some conventional schemes, different epitaxial layer regions are formed over a substrate such that GAA transistors are formed in some regions and FinFETs are formed in other regions. For example, a stack of alternating layers of two different semiconductor materials may be deposited all over the substrate. Then, the stack of alternating layers of two different semiconductor materials is selectively removed from a first area of the substrate while the stack is left in place in a second area of the substrate. A semiconductor layer is then epitaxially deposited in the first area. FinFETs are fabricated over and from the first area and GAA transistors are fabricated over and from the second area. The formation of different epitaxial regions in these conventional schemes involves additional steps that may increase cost and reduce yield. The present disclosure provides a method to fabricate GAA transistors and FinFETs on the same substrate without forming different epitaxial layer regions over the substrate. FinFETs fabricated according to methods of the present disclosure include alternating layers of two semiconductor materials conventionally suitable for formation of GAA transistors. For that reason, a FinFET fabricated according to methods of the present disclosure may be referred to as a layered FinFET.

Illustrated in FIG. 1 is a method 100 of forming a semiconductor device having multiple device areas of multi-gate devices. As used herein, the term "multi-gate device" is used to describe a device (i.e., a semiconductor device) that has at least some gate material disposed on multiple sides of at least one channel of the device. In some examples, the multi-gate device may be a GAA device having gate material disposed on at least four sides of at least one channel members of the device or a FinFET having gate material disposed on three sides of a fin-shaped channel region. A channel member in a GAA transistor may be referred to as a nanowire, nanosheet, nanostructure, channel member, or semiconductor channel member. A channel member in a GAA transistor may be of various geometries (e.g., cylindrical, bar-shaped, sheet-shaped) and various dimensions.

Operations of the method 100 or other method embodiments will be described below in conjunction with fragmentary cross-sectional views of a workpiece 200 illustrated in FIG. 2-16. Some of the operations may only be briefly described herein. Upon conclusion of the operations of method 100, the workpiece 200 will be fabricated into a semiconductor device 200. In that sense, the workpiece 200 may be referred to as the semiconductor device 200 as the context requires. Further, the exemplary semiconductor devices may include various other devices and features, such as other types of devices including additional transistors, bipolar junction transistors, resistors, capacitors, inductors, diodes, fuses, SRAM and/or other logic circuits, etc., but is simplified for a better understanding of the inventive concepts of the present disclosure. In some embodiments, the exemplary devices include a plurality of semiconductor devices (e.g., transistors), including n-type GAA transistors, p-type GAA transistors, PFETs, NFETs, etc., which may be interconnected. Moreover, it is noted that the process steps of method 100, including any descriptions given with reference to FIGS. 2-16, as with the remainder of the method and exemplary figures provided in this disclosure, are merely exemplary and are not intended to be limiting beyond what is specifically recited in the claims that follow.

Figure 2:
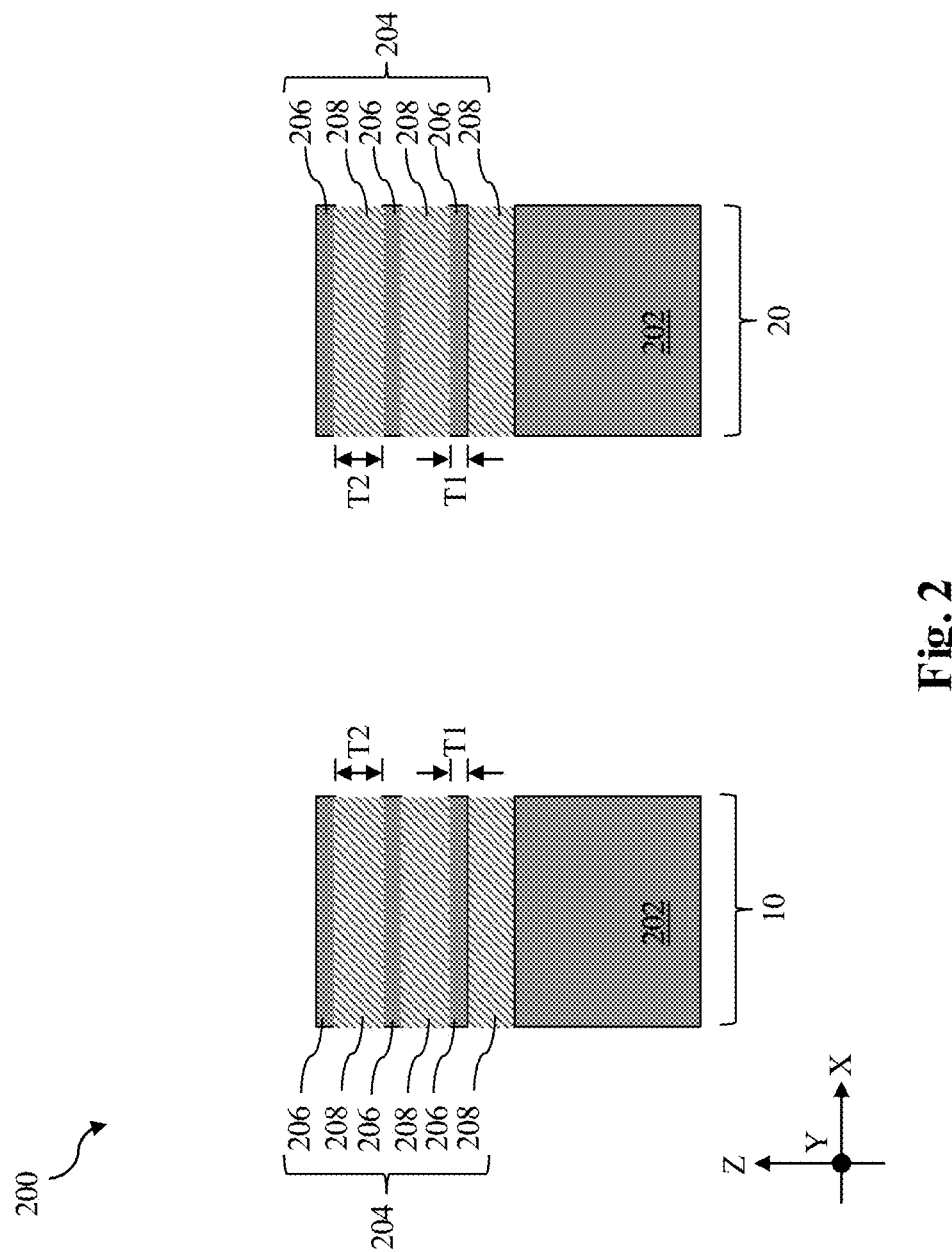
FIGS. 2-17 illustrate fragmentary cross-sectional views of a workpiece during a fabrication process according to the method of FIG. 1, according to one or more aspects of the present disclosure.

Referring to FIGS. 1 and 2, the method 100 includes block 102 where a stack 204 is formed over a substrate 202. The stack 204 includes semiconductor layers 206 and sacrificial layers 208 stacked vertically in an alternating fashion. A workpiece 200 having a first device area 10 and a second device area 20 is illustrated in FIG. 2. The workpiece 200 includes a substrate 202, which may be a semiconductor substrate such as a silicon substrate. The substrate 202 may include various layers, including conductive or insulating layers formed on a semiconductor substrate. The substrate 202 may include various doping configurations depending on design requirements as is known in the art. For example, different doping profiles (e.g., n-wells, p-wells) may be formed on the substrate 202 in regions designed for different device types (e.g., n-type GAA transistors, p-type GAA transistors). The suitable doping may include ion implantation of dopants and/or diffusion processes. The substrate 202 may also include other semiconductors such as germanium, silicon carbide (SiC), silicon germanium (SiGe), or diamond. Alternatively, the substrate 202 may include a compound semiconductor and/or an alloy semiconductor. In an embodiment of the method 100, an anti-punch through (APT) implant is performed. The APT implant may be performed in a region underlying the channel region of a device for example, to prevent punch-through or unwanted diffusion.

The stack 204 includes semiconductor layers 206 interposed by sacrificial layers 208. The stack 204 may also be referred to as a layer stack 204 or an epitaxial stack 204. As shown in FIG. 2, the semiconductor layers 206 and the sacrificial layers 208 are alternatingly deposited along the Z direction such that they are interleaved. Compositions of the semiconductor layers 206 and sacrificial layers 208 are different to allow selective removal of the sacrificial layers 208 in a subsequent operation. In some embodiments, the semiconductor layers 206 may be formed of silicon (Si), germanium (Ge), silicon germanium (SiGe), germanium tin (GeSn), silicon germanium tin (SiGeSn), gallium arsenide (GaAs), aluminum gallium arsenide (AlGaAs), indium arsenide (InAs), or a combination thereof, while the sacrificial layers 208 may be formed of a semiconductor material or a dielectric material. In some implementations, the semiconductor material for the sacrificial layers 208 may include silicon (Si), germanium (Ge), silicon germanium (SiGe), germanium tin (GeSn), silicon germanium tin (SiGeSn), or a combination there. In some implementations, the dielectric material for the sacrificial layers 208 may include silicon oxide, silicon nitride, or silicon oxynitride. For the avoidance of doubts, although the material selections for the semiconductor layers 206 and the sacrificial layers 208 may overlap, the compositions of selection for the semiconductor layers 206 and sacrificial layers 208 are different in terms of etching selectivity or oxidation rate in the presence of oxidizing agents. When both the semiconductor layers 206 and the sacrificial layers 208 are formed of semiconductor materials, they may also be formed of a semiconductor material selected from silicon carbide (SiC), gallium phosphide (GaP), indium phosphide (InP), indium antimonide (InSb), gallium arsenide phosphide (GaAsP), aluminum indium arsenide (AlInAs), indium gallium arsenide (InGaAs), gallium indium phosphide (GaInP), and/or gallium indium arsenide phosphide (GaInAsP), or combinations thereof. In one embodiment, the semiconductor layers 206 may be formed of silicon (Si) and the sacrificial layers 208 may be formed of silicon germanium (SiGe).

The stack 204 may be formed using an epitaxial growth process, such as a molecular beam epitaxy (MBE) process, a metalorganic chemical vapor deposition (MOCVD) process, and/or other suitable epitaxial growth processes. In some embodiments, the semiconductor layers 206 include the same material as the substrate 202. In some embodiments where both the semiconductor layers 206 and the sacrificial layers 208 are formed of semiconductor materials, the semiconductor layers 206 and the sacrificial layers 208 may be substantially dopant-free (i.e., having an extrinsic dopant concentration from about 0 $cm^{-3}$ to about $1\times10^{17}$ $cm^{-3}$), where for example, no intentional doping is performed during their epitaxial growth processes.

It is noted that three (3) layers of the semiconductor layers 206 and three (3) layers of the sacrificial layers 208 are alternately arranged as illustrated in FIG. 2 as well as in other figures, which are for illustrative purposes only and not intended to be limiting beyond what is specifically recited in the claims. It can be appreciated that any number of epitaxial layers can be formed in the epitaxial stack 204. The number of layers depends on the desired number of channels members for the device 200. In some embodiments, a number of semiconductor layers 206 may be between 2 and 10. It is also noted that while the first device area 10 and the second device area 20 of the workpiece 200 are illustrated separately in FIG. 2, the first device area 10 and the second device area 20 shown in FIG. 2 are snapshots of different device areas on the workpiece 200. In terms of the substrate 202, the first device area 10 and the second device area 20 also represent different areas over the substrate 202.

In some embodiments as shown in FIG. 2, each of the semiconductor layers 206 has a substantially identical first thickness (T1) and each of the sacrificial layers 208 has a substantially identical second thickness (T2). Here, being substantially identical refers to the lack of intentional thickness variation. The first thickness T1 and the second thickness T2 may be selected based on different considerations, such as channel widths of the resulting GAA transistors and difficulties to form the various layers in the gate structures. As will be described in more detail below, the semiconductor layers 206 or parts thereof will become channel member(s) for a subsequently-formed GAA transistor. For that reason, the semiconductor layers 206 may also be referred to as channel layers 206. A greater first thickness T1 of the semiconductor layers 206 would lead to greater channel widths. The sacrificial layers 208 that come between the semiconductor layers 206 may eventually be removed to release the channel members formed of the semiconductor layers 206. A second thickness T2 of the sacrificial layers 208 serve to define a vertical distance between adjacent channel region(s). As a result, when greater channel widths are desired, the first thickness T1 may be greater than the second thickness T2. When difficulties in forming the gate structures are the concern, the second thickness T2 may be equal to or smaller than the first thickness T1.

Figure 3:
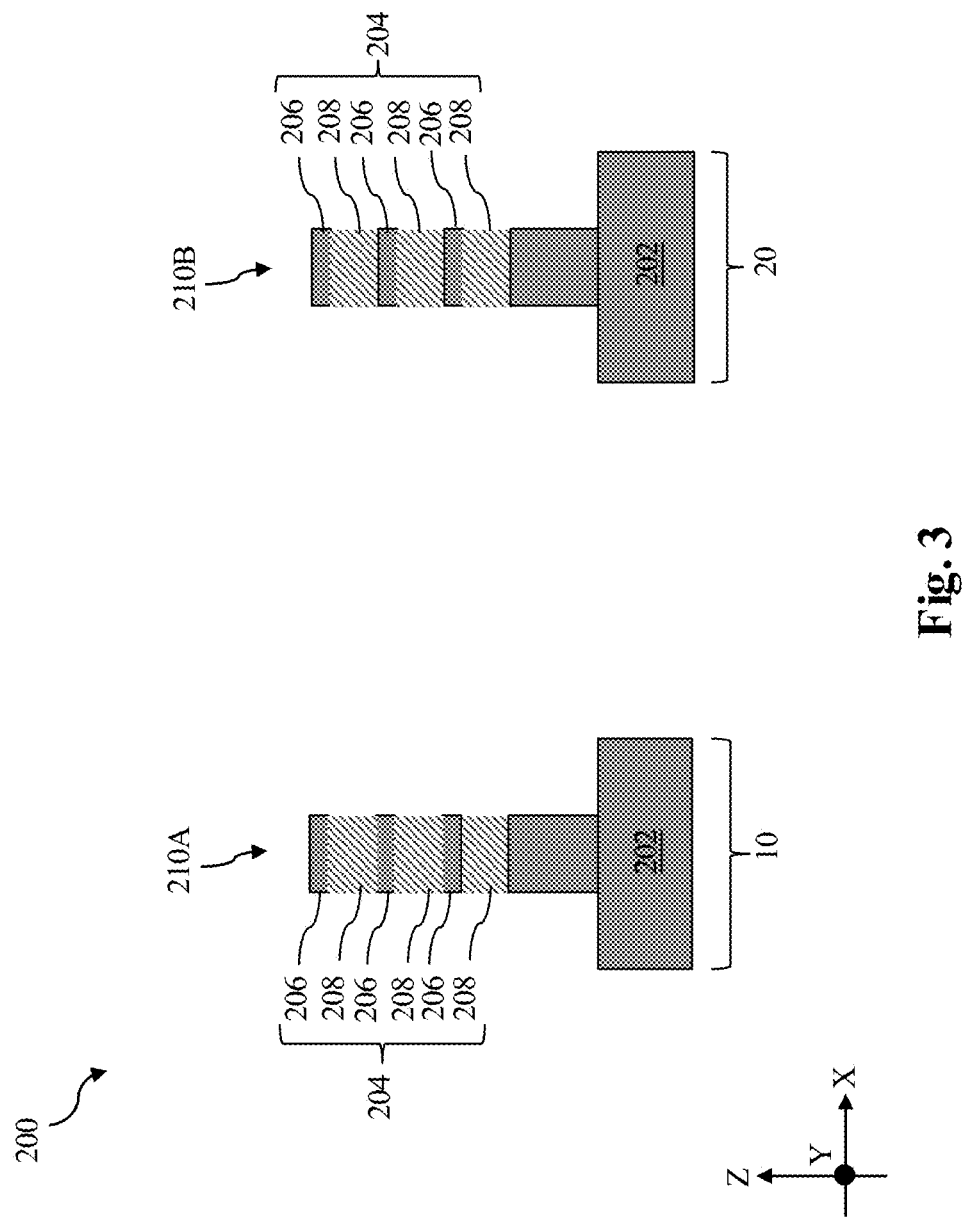
Figure 4:
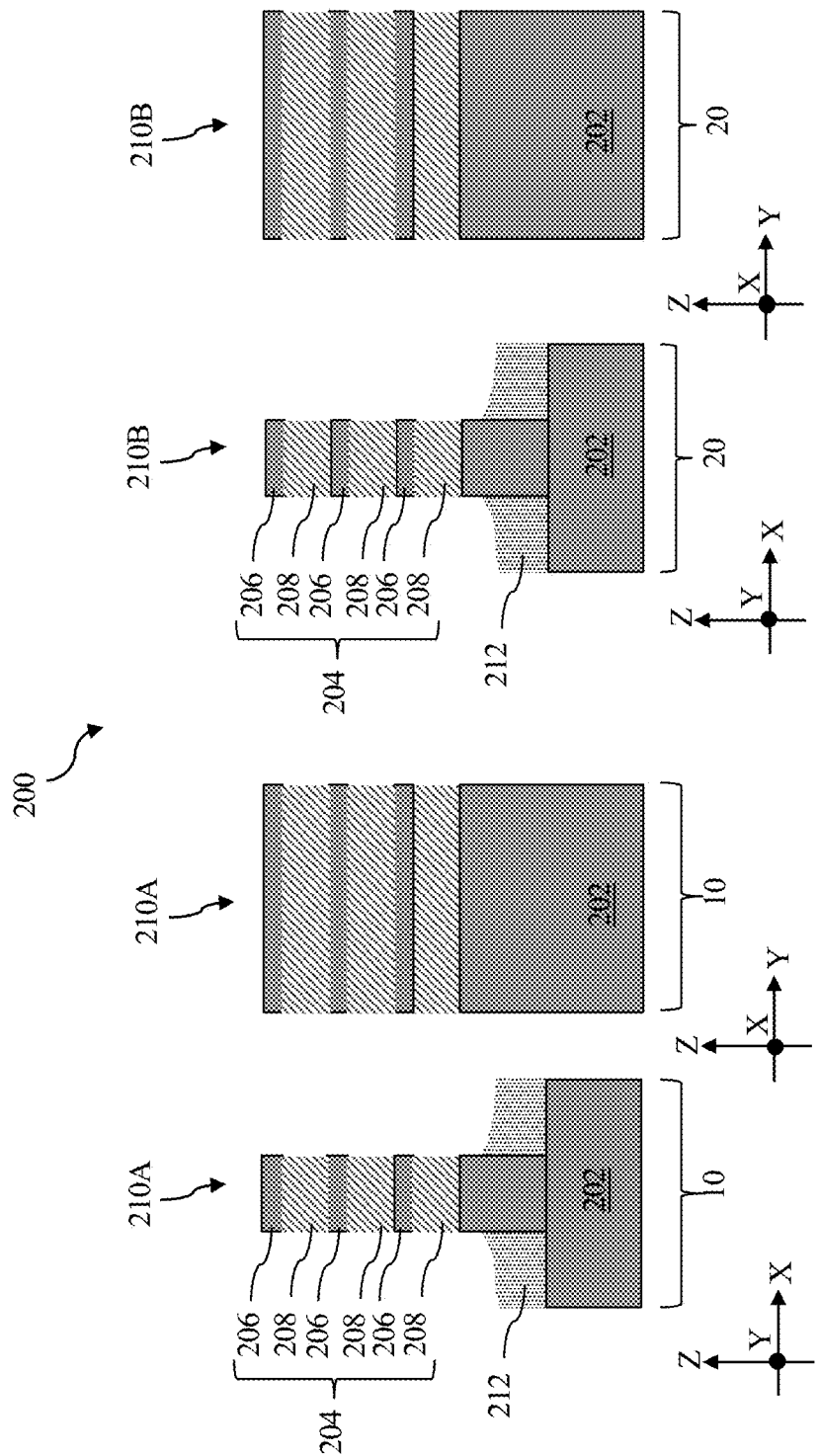

Referring to FIGS. 1, 3 and 4, the method 100 includes a block 104 where a first fin element 210A is formed from the stack 204 in the first device area 10 and a second fin element 210B is formed from the stack 204 in the second device area 20. Although not shown in detail, in some example processes, a fin top hard mask layer may be deposited over the workpiece 200, including over the stack 204. The fin top hard mask layer may be a single layer or a multilayer. In some implementations, the fin top hard mask layer may include silicon oxide, silicon nitride, silicon oxynitride, silicon oxycarbonitride, silicon carbide, or a combination thereof. In embodiments where the fin top hard mask layer is a multilayer, it may include a silicon oxide layer deposited on the stack 204 and a silicon nitride layer deposited on the silicon oxide layer. The fin top hard mask layer is used in a patterning process to pattern the fin top hard mask layer. The patterned fin top hard mask layer is then used as an etch mask to form the first fin element 210A and the second fin element 210B. For example, the patterning process may include a lithography process (e.g., photolithography or e-beam lithography) which may further include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. In some embodiments, the etching process may include dry etching (e.g., RIE etching), wet etching, and/or other etching methods. The patterning process may be performed to the workpiece 200 until the first and second fin elements 210A and 210B extend from the substrate 202. In some embodiments, the patterning also etches into the substrate 202 such that each of the first and second fin elements 210A and 210B includes a lower portion formed from the substrate 202 and an upper portion from the stack 204. The upper portion includes each of the semiconductor layers 206 and the sacrificial layers 208 in the stack 204. In some embodiments, the first and second fin elements 210A and 210B may be fabricated using double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial dummy layer is formed over a substrate and patterned using a photolithography process. Spacers are formed alongside the patterned sacrificial dummy layer using a self-aligned process. The sacrificial dummy layer is then removed, and the remaining spacers, or mandrels, may then be used to pattern the first and second fin elements 210A and 210B by etching the stack 204. As shown in FIG. 3, the first and second fin elements 210A and 210B extend lengthwise along the Y direction (i.e., into or out of FIG. 3).

Reference is now made to FIG. 4. After the first and second fin elements 210A and 210B are formed, isolation feature 212 is formed between neighboring fin elements, such as between two adjacent first fin elements 210A (only one shown in the first device area 10) or between two adjacent second fin elements 210B (only one shown in the second device area 20). The isolation feature 212 may also be referred to as a shallow trench isolation (STI) feature 212. By way of example, in some embodiments, a dielectric layer is first deposited over the substrate 202, filling the trenches between the first and second fin elements 210A and 210B with the dielectric material. In some embodiments, the dielectric layer may include silicon oxide, silicon nitride, silicon oxynitride, fluorine-doped silicate glass (FSG), a low-k dielectric, combinations thereof, and/or other suitable materials. In various examples, the dielectric layer may be deposited by a CVD process, a subatmospheric CVD (SACVD) process, a flowable CVD process, an ALD process, a physical vapor deposition (PVD) process, and/or other suitable process. The deposited dielectric material is then thinned and planarized, for example by a chemical mechanical polishing (CMP) process. The planarized dielectric layer is further recessed by a dry etching process, a wet etching process, and/or a combination thereof to form the STI features 212. After the recess, at least the upper portions of the first and second fin elements 210A and 210B rise above the STI features 212. In some embodiments, the dielectric layer (and the subsequently formed STI features 212) may include a multi-layer structure, for example, having one or more liner layers. To better illustrate the various embodiments of the present disclosure, from FIG. 4 onward, each of the first fin element 210A in the first device area 10 and the second fin element 210B in the second device area 20 is shown above along the lengthwise direction (Y direction) and along the widthwise direction (X direction).

Figure 5:
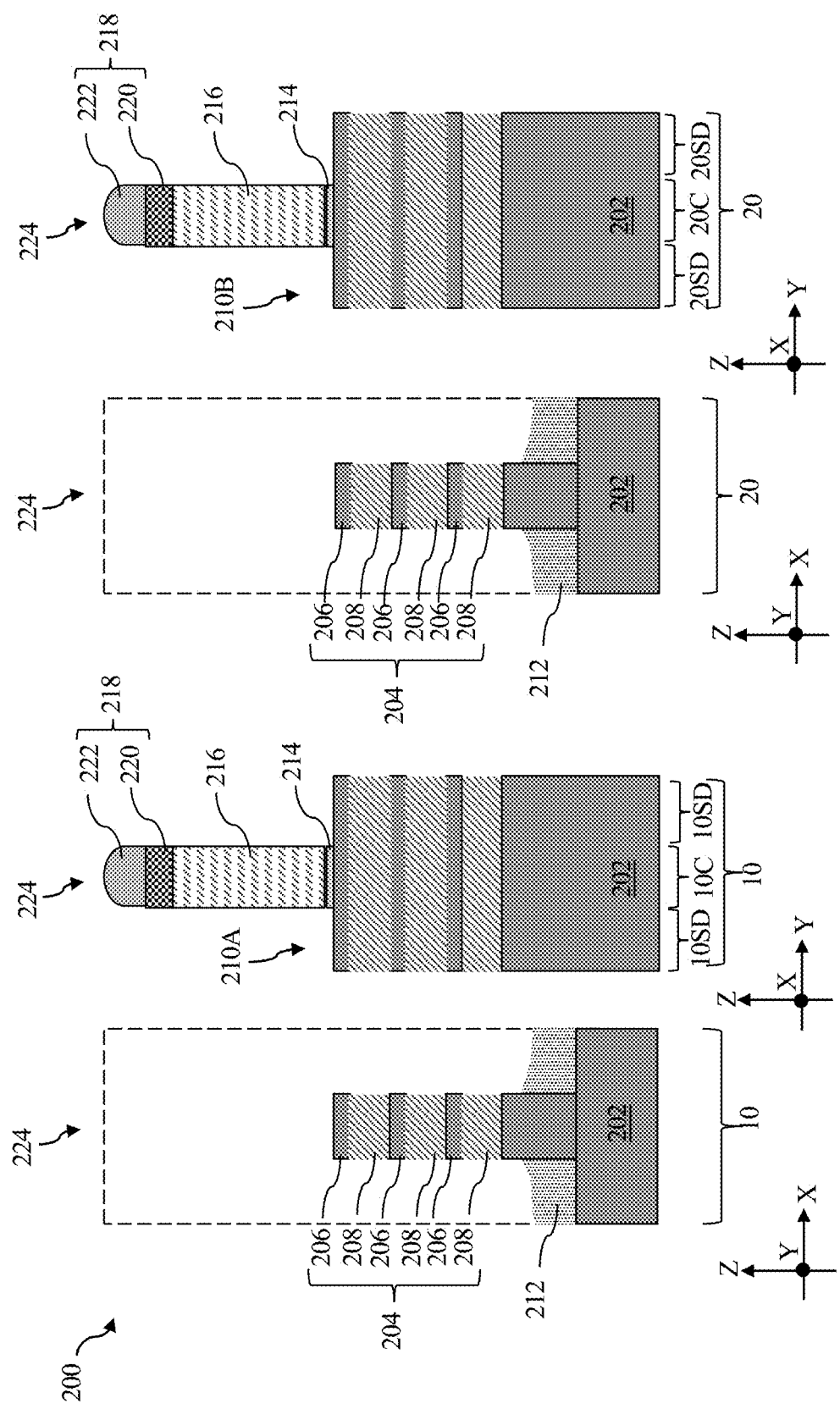

Referring to FIGS. 1 and 5, method 100 includes a block 106 where dummy gate stacks 224 are formed over a channel region 10C of the first fin element 210A and a channel region 20C of the second fin element 210B. Although the dummy gate stacks 224 do not appear in the cross-sectional views along the Y direction, the dummy gate stacks 224 are shown in dotted lines in FIG. 5. For simplicity, the dummy gate stacks 224 are not shown in dotted lines in subsequent figures. In some embodiments, a gate replacement process (or gate-last process) is adopted where the dummy gate stacks 224 serve as placeholders for functional gate structures and are to be removed and replaced by the functional gate structures in a subsequent process. Other processes and configuration are possible. As shown in FIG. 5, a dummy dielectric layer 214, which may be formed of silicon oxide, silicon nitride, or other suitable dielectric material, is first deposited by a CVD process, a sub-atmospheric CVD (SACVD) process, a flowable CVD process, an ALD process over the workpiece 200, including over the first fin element 210A and the second fin element 210B. The dummy dielectric layer 214 may be used to prevent damages to the fin elements by subsequent processes. A dummy gate electrode layer 216, which may be formed of polysilicon, is then deposited over the dummy dielectric layer 214. For patterning purposes, a gate top hard mask 218 may be deposited over the dummy gate electrode layer 216. The gate top hard mask 218 may be a single layer or a multilayer and may include silicon oxide, silicon nitride, silicon oxynitride, silicon carbide, silicon oxycarbonitride, or a combination thereof. In instances where the gate top hard mask 218 is a multilayer, the gate top hard mask 218 includes a silicon oxide layer 220 deposited on the dummy gate electrode layer 216 and a silicon nitride layer 222 deposited on the silicon oxide layer 220. The gate top hard mask 218, the dummy gate electrode layer 216, and the dummy dielectric layer 214 are patterned a patterning process that may include a lithography process (e.g., photolithography or e-beam lithography) which may further include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. In some embodiments, the etching process may include dry etching (e.g., RIE etching), wet etching, and/or other etching methods.

After the dummy gate stacks 224 are formed over the channel region 10C of the first fin element 210A, the source/drain (S/D) regions 10SD adjacent to the channel region 10C are also defined. Similarly, after the dummy gate stacks 224 are formed over the channel region 20C of the second fin element 210B, the source/drain (S/D) regions 20SD adjacent to the channel region 20C are also defined.

Figure 6:
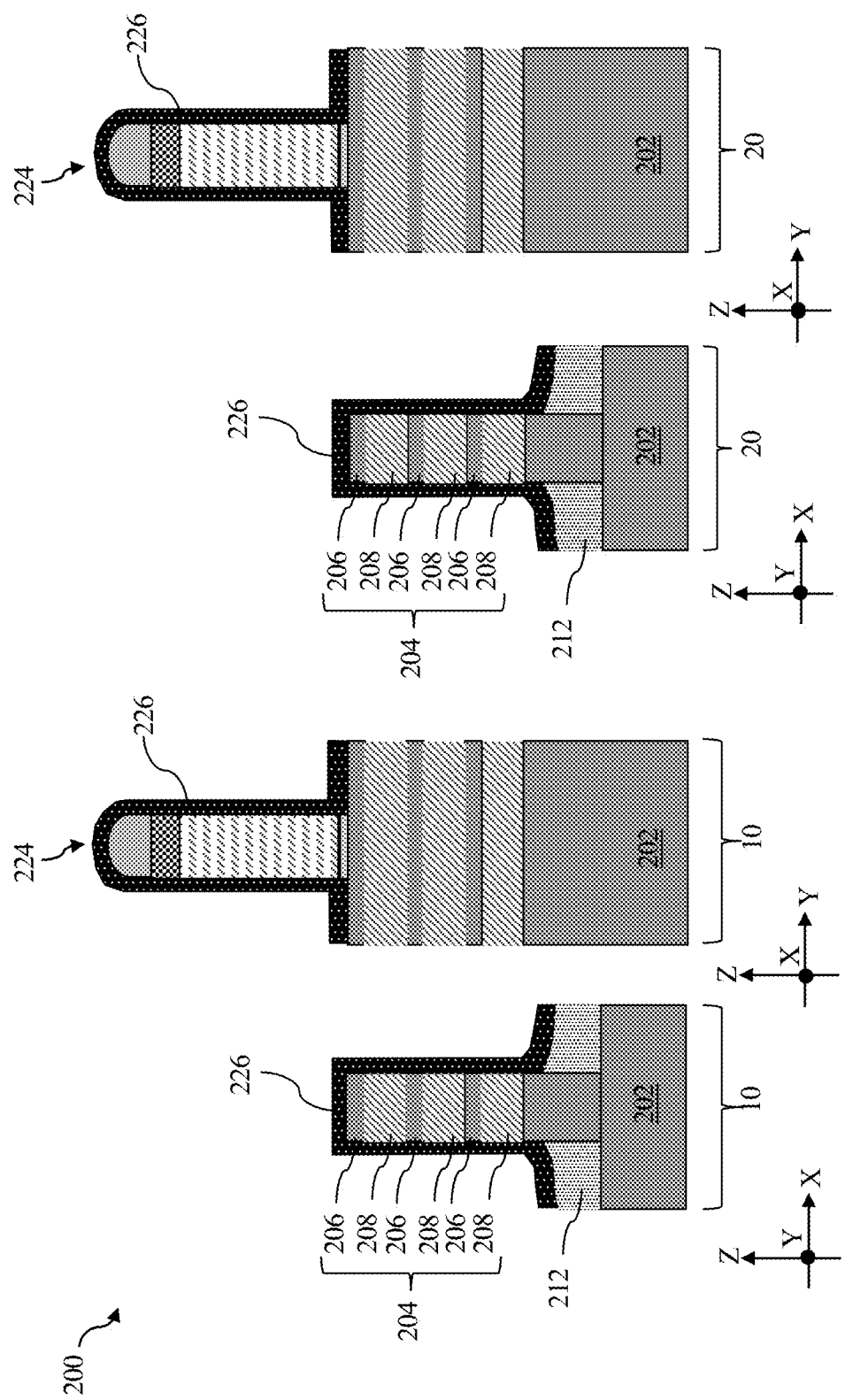

Referring to FIGS. 1 and 6, the method 100 includes a block 108 where a gate spacer layer 226 is deposited over the workpiece 200, including over the dummy gate stacks 224, the first fin element 210A, and the second fin element 210B. In some embodiments, material for forming the gate spacer layer 226 is deposited conformally over the workpiece 200, including over top surfaces and sidewalls of the dummy gate stacks 224. The term "conformally" may be used herein for ease of description of a layer having substantially uniform thickness over various regions. The gate spacer layer 226 may have a single-layer construction or include multiple layers. In some embodiments represented in FIG. 6, the gate spacer layer 226 includes a single-layer construction. The gate spacer layer 226 may include silicon oxide, silicon oxynitride, silicon nitride, silicon carbonitride, silicon oxycarbide, silicon oxycarbonitride, other suitable dielectric material, or a combination thereof. The spacer material may be deposited over the dummy gate stack 224 using processes such as, CVD process, a subatmospheric CVD (SACVD) process, a flowable CVD process, an ALD process, or other suitable process. The gate spacer material is then etched back in an anisotropic etch process to form the gate spacer layer 226. The anisotropic etch process exposes portions of the first fin element 210A and the second fin element 210B adjacent to but not covered by the dummy gate stacks 224 (e.g., over source/drain regions 10SD and 20SD). Although not explicitly shown in FIG. 6, in some alternative embodiments, portions of the gate spacer material directly above the dummy gate stacks 224 may be partially or completely removed by this anisotropic etching process while the gate spacers layer 226 remain on sidewalls of the dummy gate stacks 224.

Figure 7:
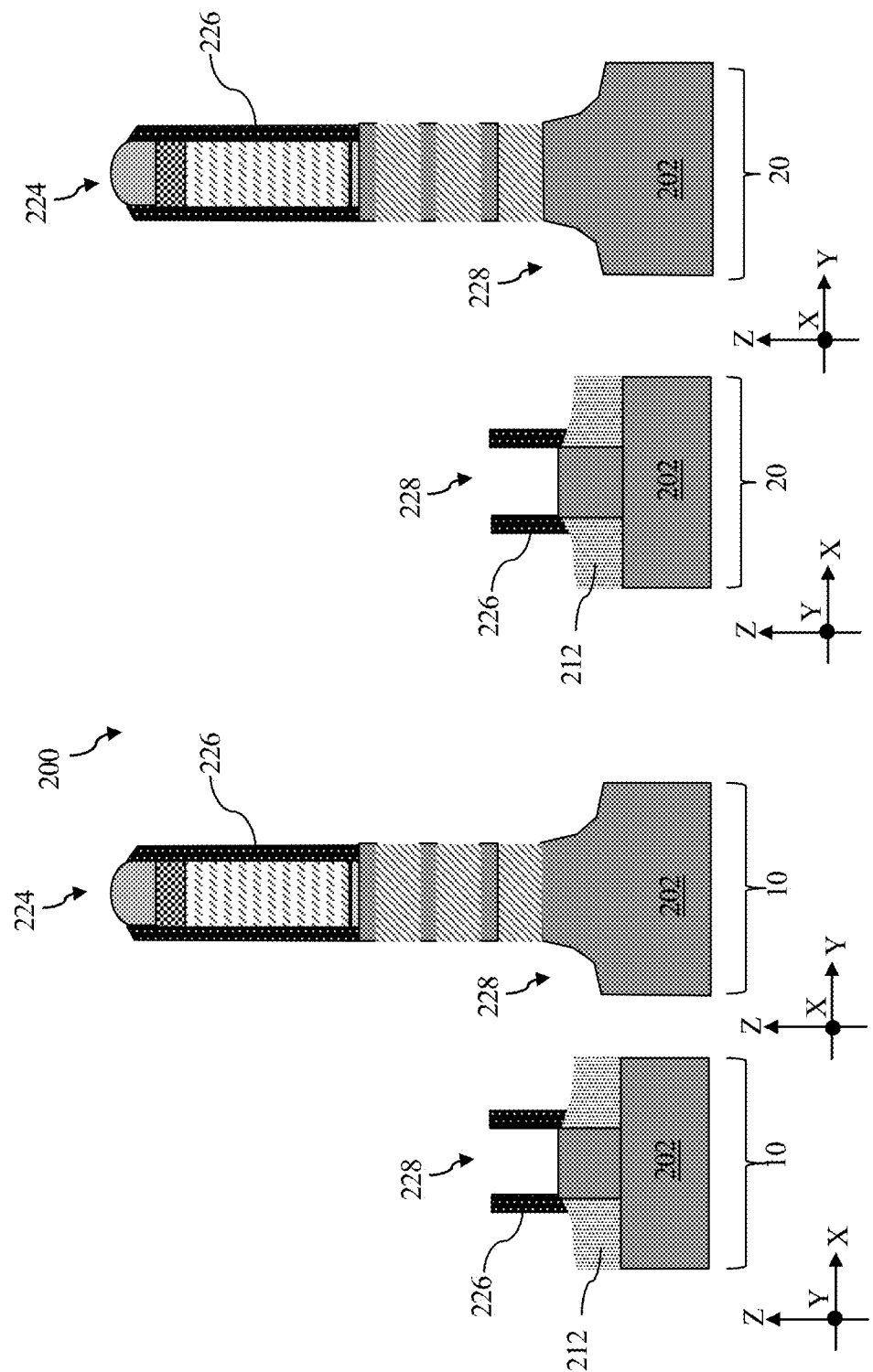

Referring to FIGS. 1 and 7, the method 100 includes a block 110 where source/drain recesses 228 are formed in the first fin element 210A and the second fin element 210B using gate spacer layer 226 and the dummy gate stacks 224 as an etch mask. In some embodiments, source/drain regions 10SD of the first fin elements 210A in the first device area 10 and source/drain regions 20SD of the second fin elements 210B are recessed to form source/drain recesses 228. The formation of the source/drain recesses 228 may be formed using a dry etch process or a wet etch process. For example, the dry etch process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof. In some embodiments represented in FIG. 7, the upper portion of the first fin element 210A and the second fin element 210B are recessed to expose sidewalls of the semiconductor layers 206 and the sacrificial layers 208. In some implementations, at least a portion of the lower portion of the first fin element 210A and the second fin element 210B are recessed as well. That is, the source/drain recesses 228 may extend below the bottom-most sacrificial layer 208 in the first device area 10 and the second device area 20. Upon conclusion of operations in block 110, the source/drain regions 10SD and 20SD of the first fin element 210A and the second fin element 210B may become level with to or lower than the top surface of the STI features 212.

Figure 8:
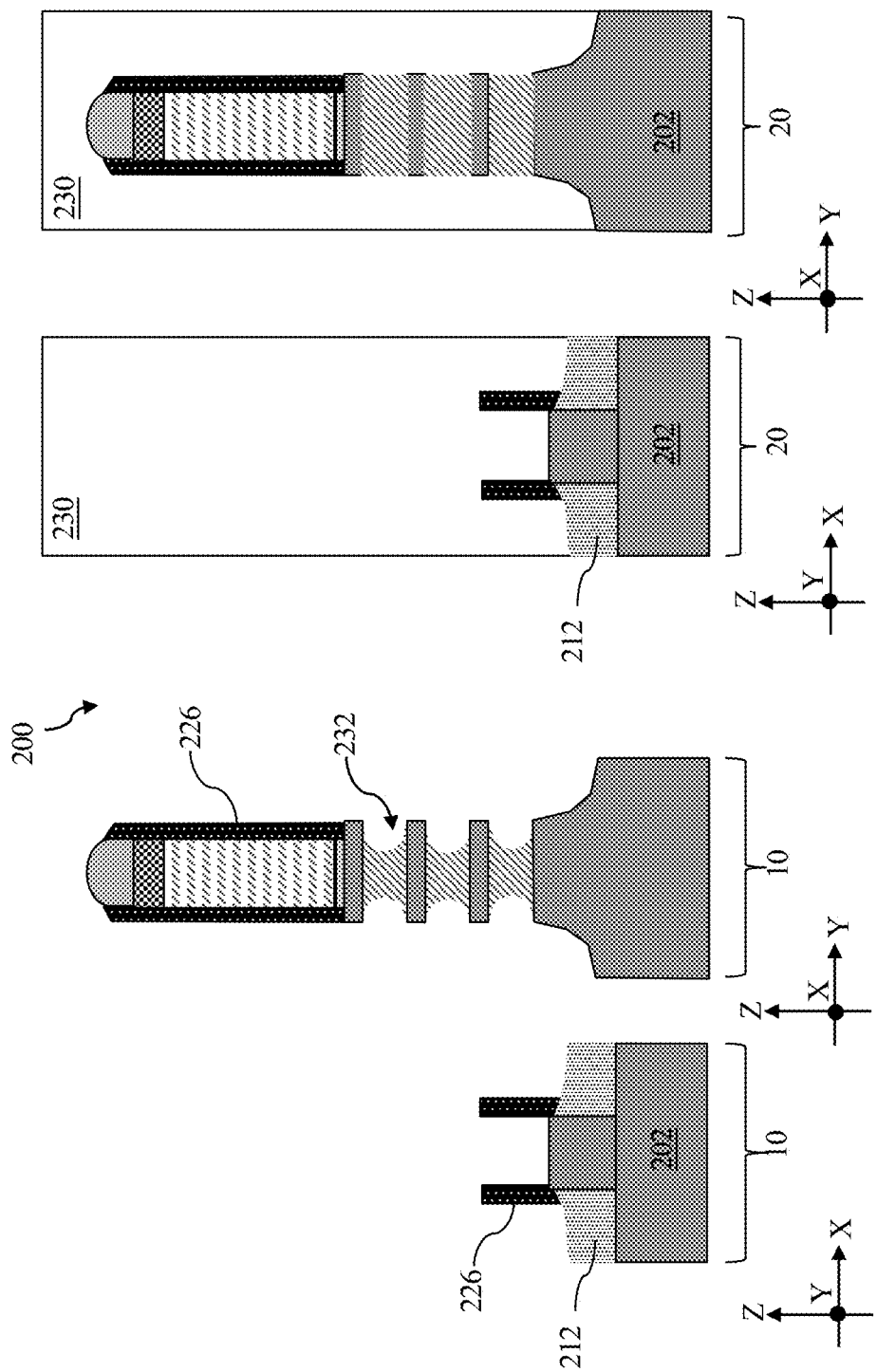

Referring to FIGS. 1 and 8, the method 100 includes block 112 where inner spacer recesses 232 are selectively formed in the first fin element 210A in the first device area 10. In some embodiments illustrated in FIG. 8, the second device area 20 may be masked by a first masking layer 230 to facilitate selective formation of the inner spacer recesses 232 in the first fin element 210A in the first device area 10. In some implementations, the first masking layer 230 may include one or more photoresist or one or more dielectric layer. The first masking layer 230 may be deposited using spin-on coating, CVD, or a suitable deposition technique. As described above with regards to the stack 204, a composition of the semiconductor layers 206 is different from that of the sacrificial layers 208. At block 112, the different compositions allow the sacrificial layers 208 in the first fin element 210A exposed in the source/drain recesses 228 to be selectively and partially recessed to form inner spacer recesses 232 while the exposed semiconductor layers 206 are substantially unetched. In an embodiment where the semiconductor layers 206 consist essentially of Si and sacrificial layers 208 consist essentially of SiGe, the selective recess of the sacrificial layers 208 may include a SiGe oxidation process followed by a SiGe oxide removal. In those embodiments, the SiGe oxidation process may include use of ozone. In some embodiments, the selective recess may be a selective isotropic etching process (e.g., a selective dry etching process or a selective wet etching process), and the extent the sacrificial layers 208 are recessed is controlled by duration of the etching process. In some embodiments, the selective dry etching process may include use of one or more fluorine-based etchants, such as fluorine gas or hydrofluorocarbons. As shown in FIG. 8, the inner spacer recesses 232 extend inward along the Y direction from the source/drain recesses 228 in the first device area 10. In some embodiments, the selective wet etching process may include a hydro fluoride (HF) or $NH_4OH$ etchant.

Figure 9:
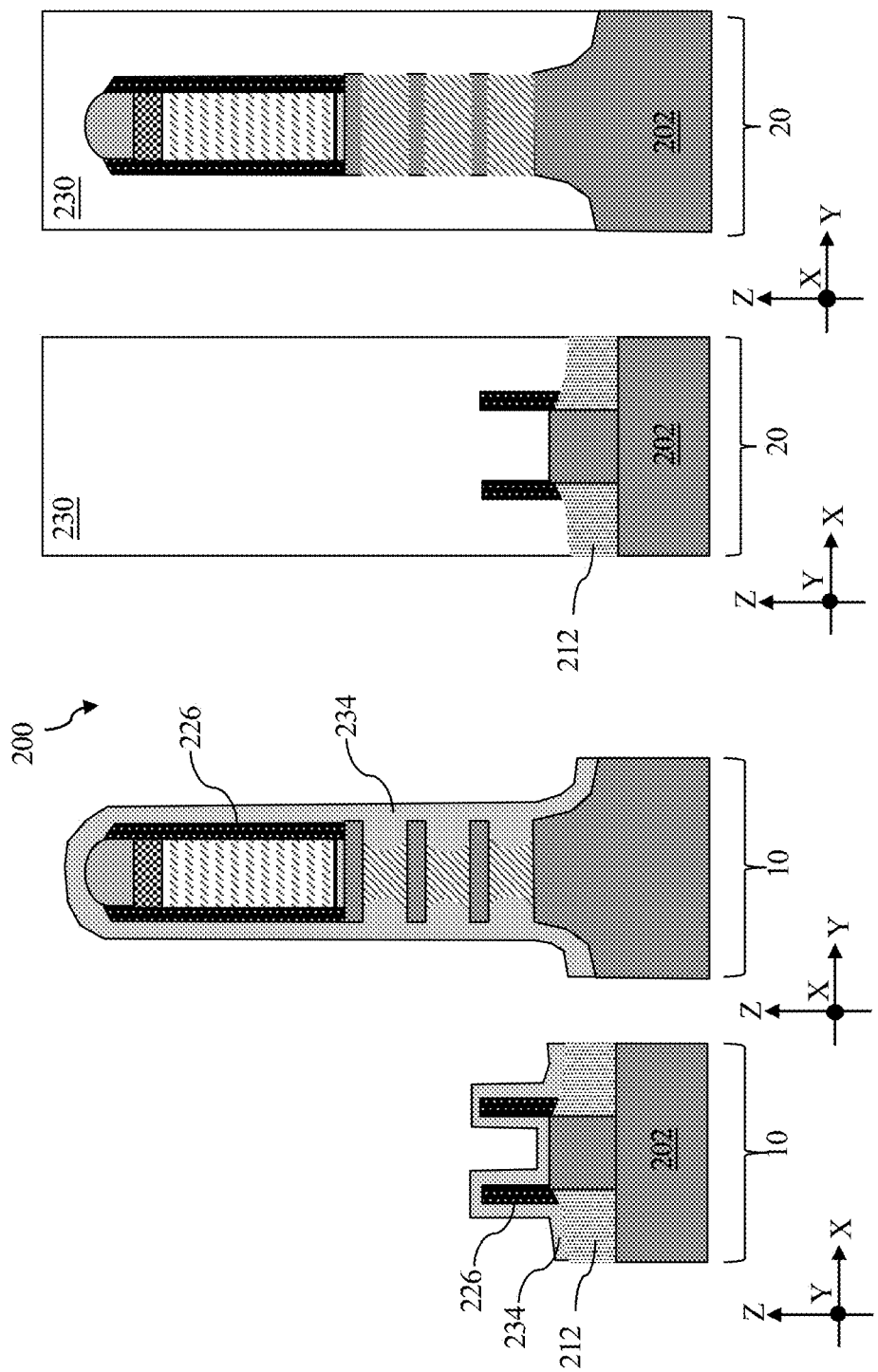
Figure 10:
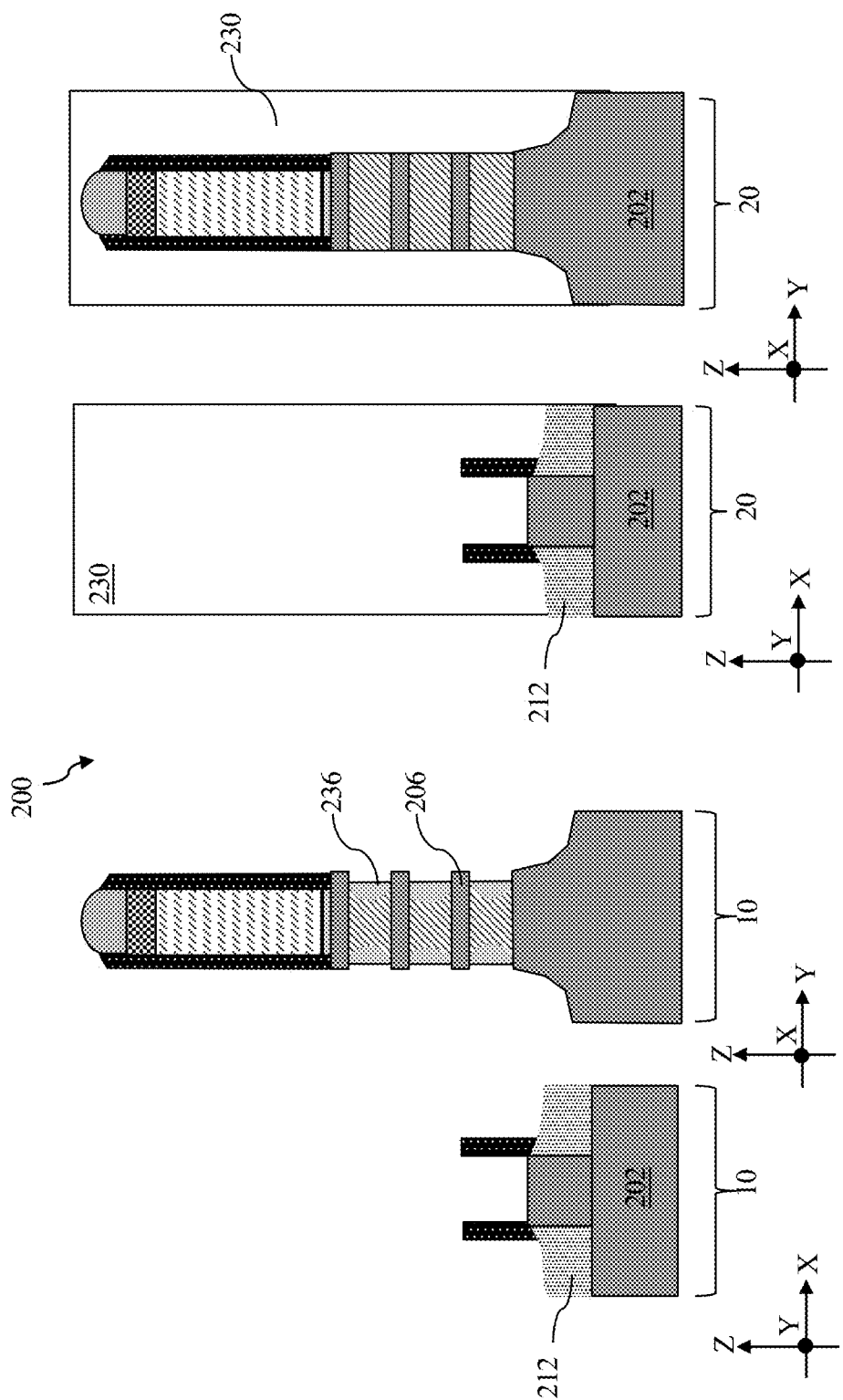

Referring to FIGS. 1, 9 and 10, the method 100 includes a block 114 where inner spacer features 236 (shown in FIG. 10) are formed in the inner spacer recesses 232. In some embodiments, an inner spacer layer 234 may be deposited over the workpiece 200 by CVD, PECVD, LPCVD, ALD or other suitable method. The inner spacer layer 234 may be formed of aluminum oxide, zirconium oxide, tantalum oxide, yttrium oxide, titanium oxide, lanthanum oxide, silicon oxide, silicon carbonitride, silicon oxycarbonitride, silicon oxycarbide, low-k material, other suitable metal oxide, or a combination thereof. In some implementations, the inner spacer layer 234 may be deposited conformally over the top surface of the gate top hard mask 218, top surface s and sidewalls of the gate spacer layer 226, portions of the substrate 202 exposed in the source/drain recesses 228, and top surfaces of the STI feature 212. Subsequently, as shown in FIG. 10, the deposited inner spacer layer 234 may be etched back to form inner spacer features 236 in the inner spacer recesses 232 in the first device area 10. In the etch back process, inner spacer layer 234 outside the inner spacer recesses 232 is removed. In some implementations represented in FIG. 10, the inner spacer features 236 are recessed such that a portion of the semiconductor layers 206 hang over the inner spacer features 236. Put differently, side surface of the inner spacer features 236 may not be flush with sidewalls of the semiconductor layers 206. Operations at blocks 112 and 114 take place while the second device area 20 remains protected and masked by the first masking layer 230. That is, inner spacer recesses 232 and inner spacer features 236 are only formed in the first device area 10 and are completely missing from the second device area 20. After the formation of the inner spacer features 236, the first masking layer 230 may be removed from the second device area 20 using etching, ashing, or a suitable method.

Figure 11:
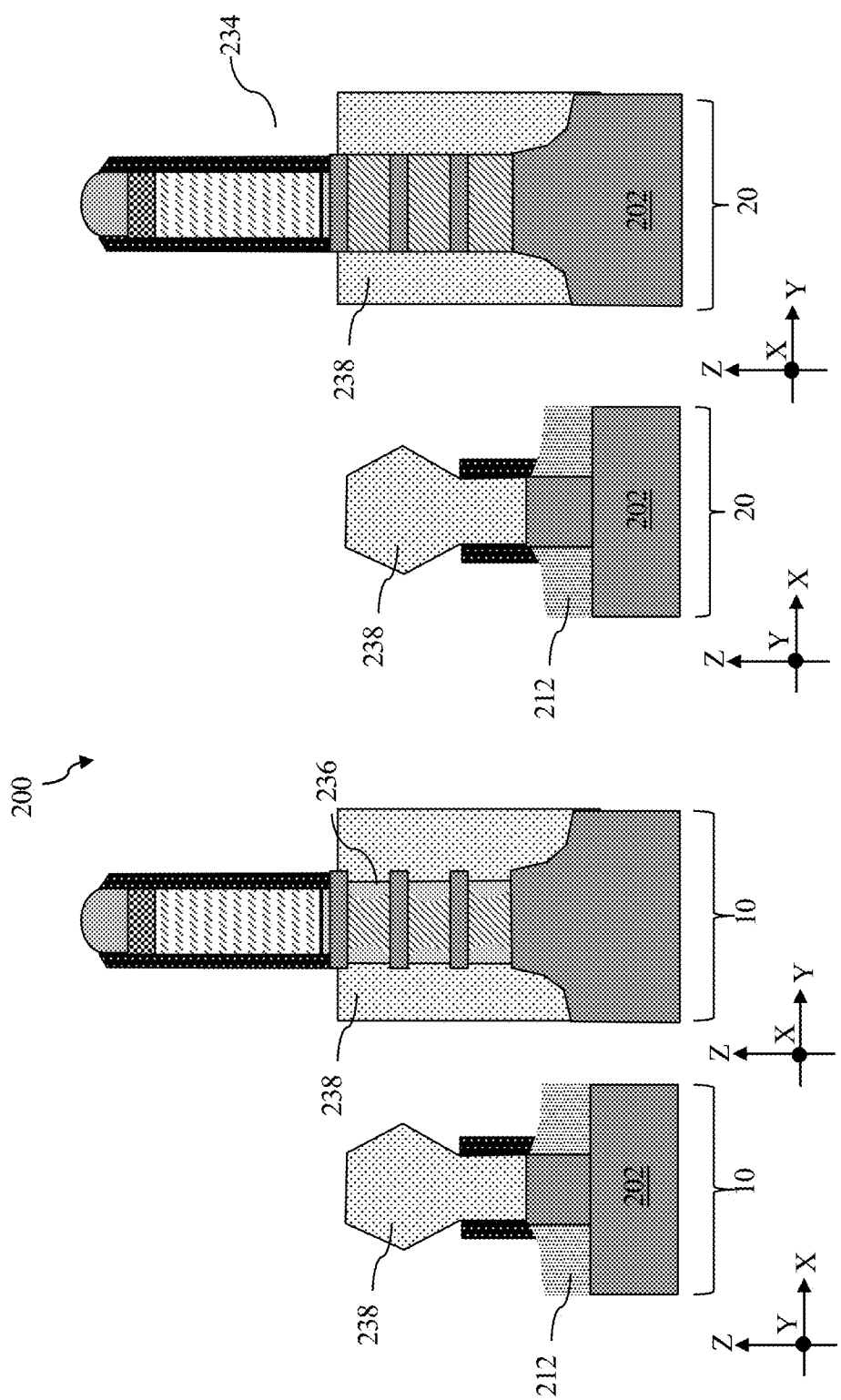

Referring to FIGS. 1 and 11, the method 100 includes a block 116 where the epitaxial source/drain features 238 are formed in the source/drain recesses 228. As the formation of the source/drain features 238 is substantially the same throughout the workpiece 200, formation of the source/drain feature 238 in the first device area 10 and the second device area 20 is collectively illustrated in FIG. 11. Although not separately shown in figures of the present disclosure, the source/drain features 238 may include n-type source/drain feature for n-type devices and p-type source/drain feature for p-type devices. In some embodiments, n-type epitaxial source/drain features of n-type devices in the workpiece 200 may be formed together while p-type epitaxial source/drain features of p-type devices in the workpiece 200 may be formed together in a preceding or a subsequent process. The source/drain features 238 may be formed using suitable epitaxial processes, such as CVD deposition techniques (e.g., vapor-phase epitaxy (VPE), ultra-high vacuum CVD (UHV-CVD)), molecular beam epitaxy (MBE), and/or other suitable processes. Example n-type epitaxial source/drain features may include Si, GaAs, GaAsP, SiP, or other suitable material. The n-type epitaxial source/drain features may be in-situ doped during the epitaxial process by introducing doping species including n-type dopants, such as phosphorus or arsenic; and/or other suitable dopants including combinations thereof. If the n-type epitaxial source/drain features are not in-situ doped, an implantation process (i.e., a junction implant process) is performed to dope the n-type epitaxial source/drain features. Example p-type epitaxial source/drain features may include Si, Ge, AlGaAs, SiGe, boron-doped SiGe, or other suitable material. The p-type epitaxial source/drain features may be in-situ doped during the epitaxial process by introducing doping species including p-type dopants, such as boron or $BF_2$, and/or other suitable dopants including combinations thereof. If the p-type epitaxial source/drain features are not in-situ doped, an implantation process (i.e., a junction implant process) is performed to dope the p-type epitaxial source/drain features.

Figure 12:
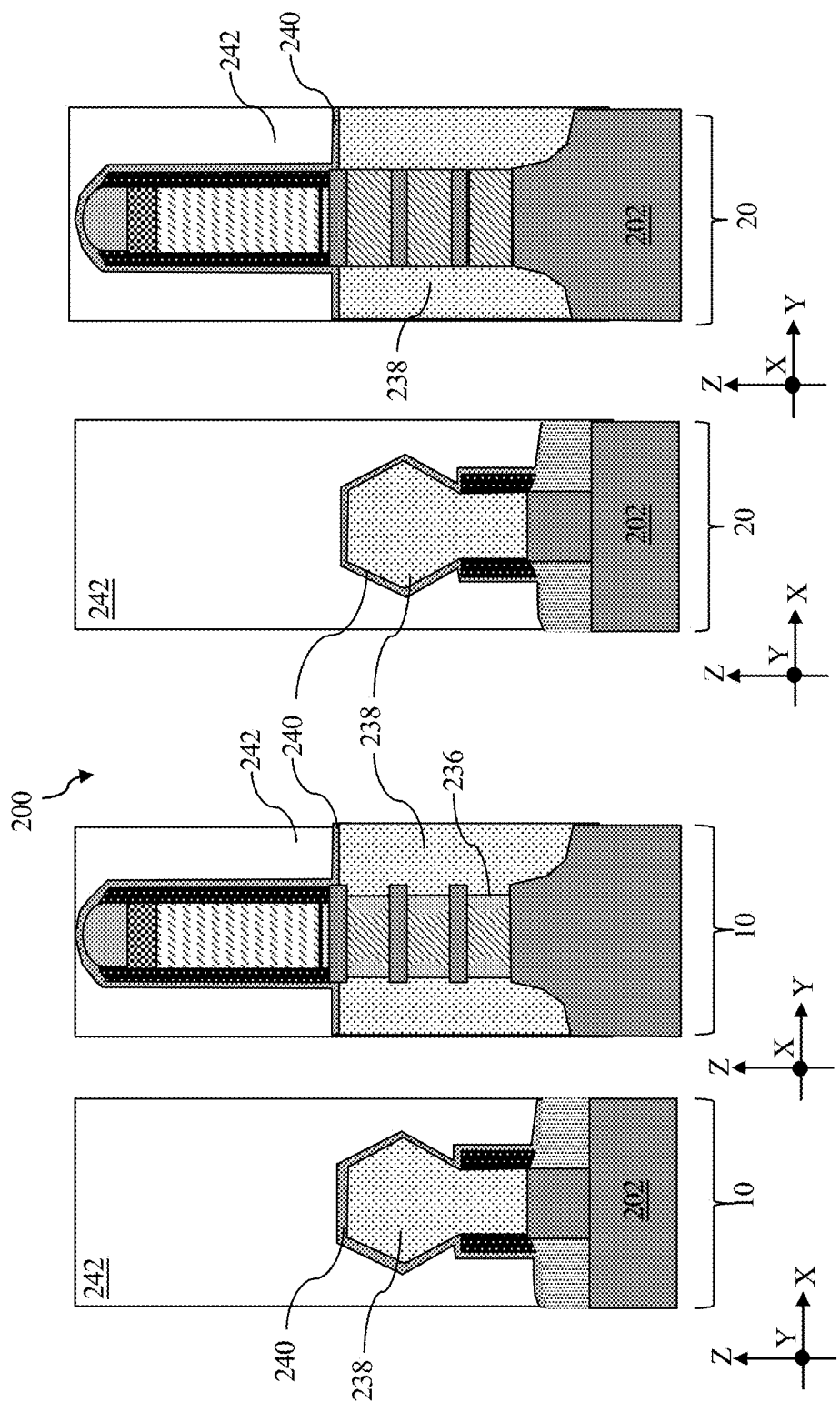

Referring to FIGS. 1 and 12, the method 100 includes a block 118 where a dielectric layer 242 is formed over the source/drain features 238. In some instances, the dielectric layer 242 may be referred to as an interlayer dielectric (ILD) layer 242. The ILD layer 242 may be substantially the same throughout the first device area 10 and the second device area 20 of the workpiece 200. In some embodiments, a contact etch stop layer (CESL) 240 is first deposited on the source/drain features 238. In some examples, the CESL 240 includes a silicon nitride layer, a silicon oxide layer, a silicon oxynitride layer, and/or other materials known in the art. The CESL 240 may be formed by ALD, plasma-enhanced chemical vapor deposition (PECVD) process and/or other suitable deposition or oxidation processes. Then the ILD layer 242 is deposited over the CESL 240. In some embodiments, the ILD layer 242 includes materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 242 may be deposited by a PECVD process or other suitable deposition technique. In some embodiments, after formation of the ILD layer 242, the workpiece 200 may be annealed to improve integrity of the ILD layer 242. As shown in FIG. 12, after the deposition and annealing of the ILD layer 242, the workpiece 200 is planarized by, for example, a chemical mechanical polishing (CMP) process, to form a level top surface for further processing.

Figure 13:
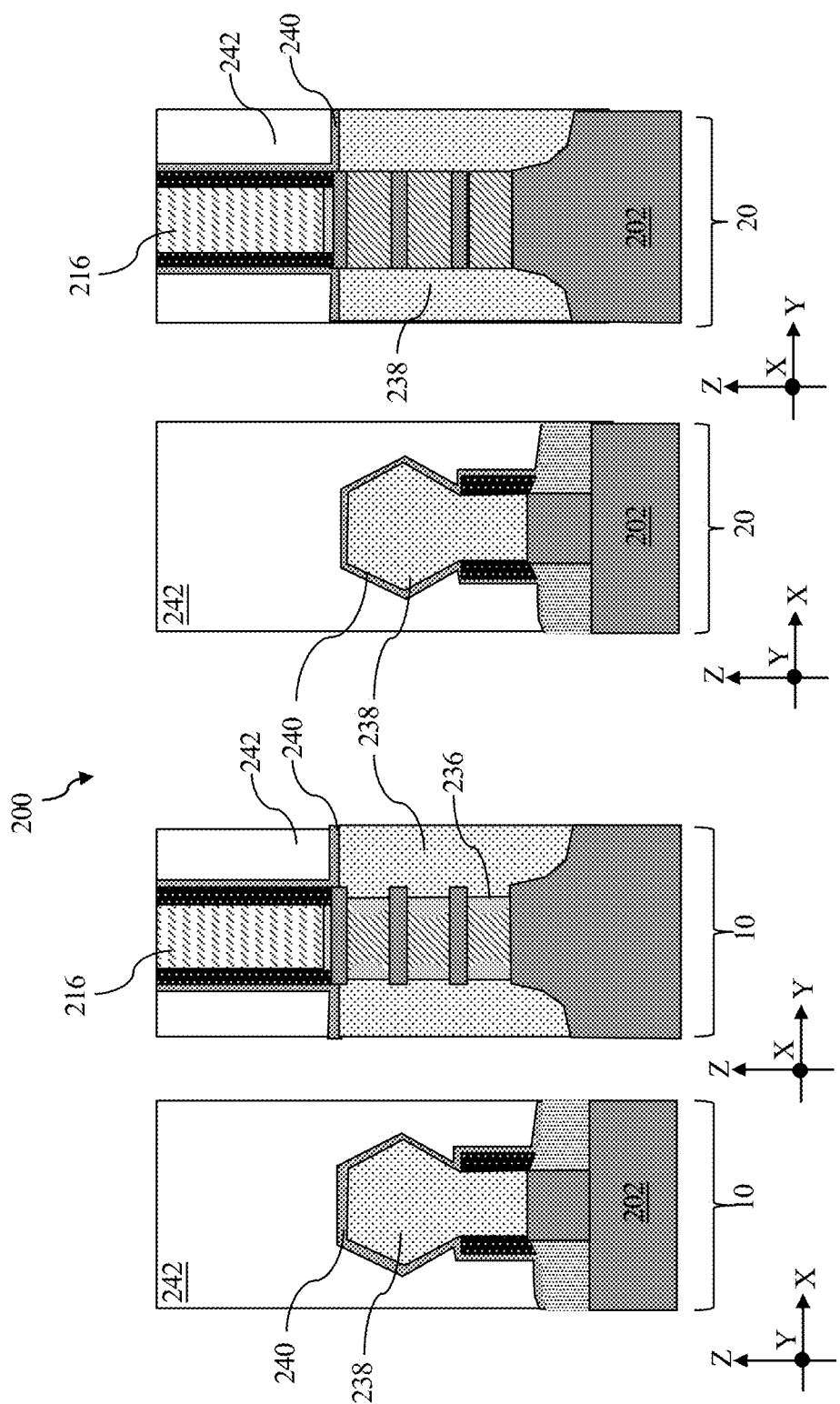
Figure 14:
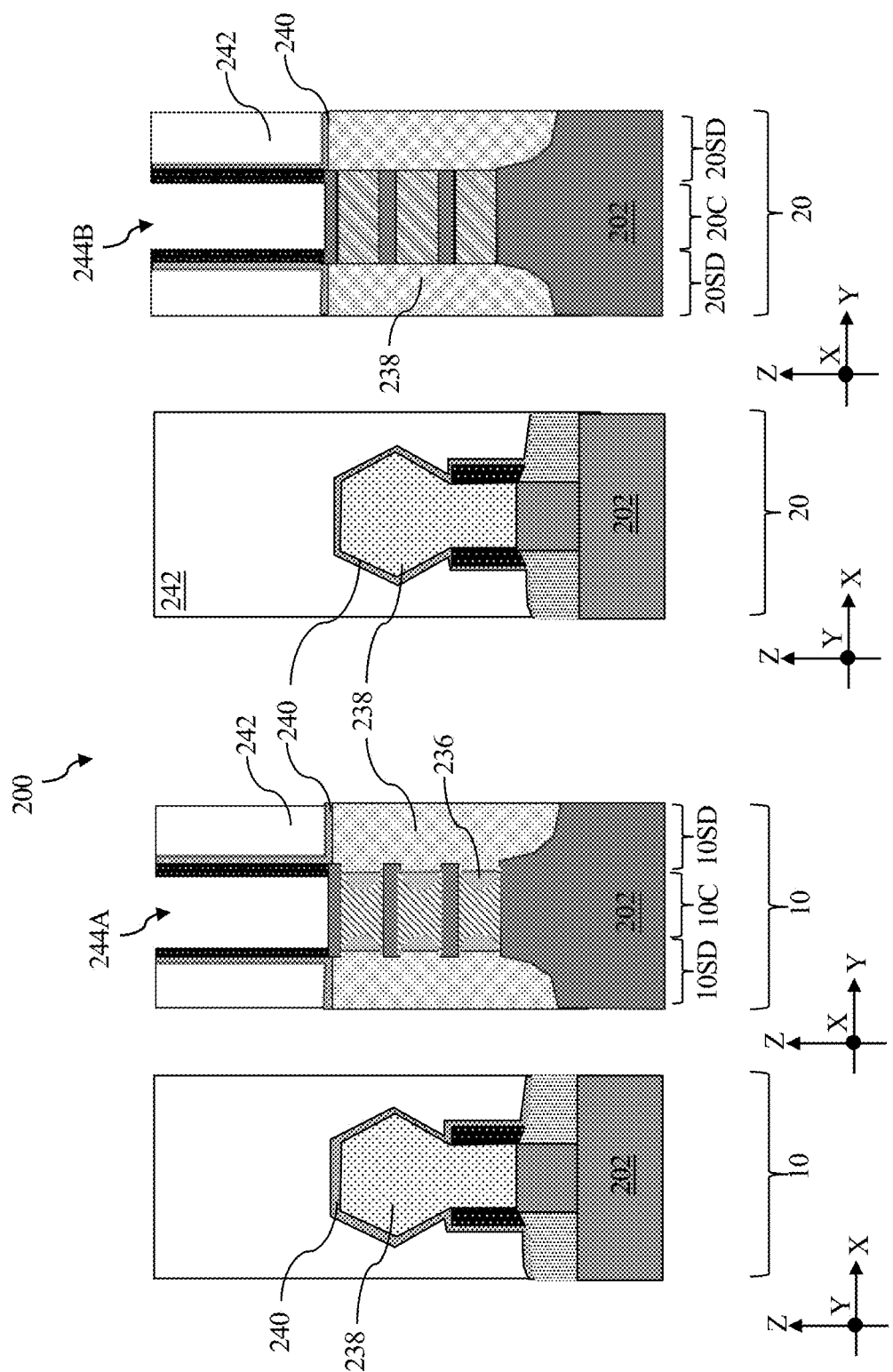

Referring to FIGS. 1, 13 and 14, the method 100 includes a block 120 where the dummy gate stacks 224 are removed to form a first gate opening 244A in the first device area 10 and a second gate opening 244B in the second device area 20. As the removal of the dummy gate stacks 224 is substantially the same throughout the workpiece 200, removal of the dummy gate stacks 224 in the first device area 10 and the second device area 20 may be performed simultaneously. In the depicted embodiment, a planarization process may be performed to remove the gate top hard mask 218 such that top surfaces of the dummy gate electrode layer 216 are exposed in both the first device area 10 and the second device area 20. Then, an etching process completely removes dummy gate electrode layer 216 and the dummy dielectric layer 214 to expose semiconductor layers 206 and sacrificial layers 208 in channel regions 10C or 20C. By this time, the dummy gate stacks 224 are substantially removed from the workpiece 200. The etching process may be a dry etching process, a wet etching process, other suitable etching process, or combinations thereof. The etching process may be selected such that it is selective to the dummy gate stacks 224 and does not substantially etch the CESL 240 and the ILD layer 242. In some implementation represented in FIG. 14, both the dummy gate stacks 224 and the dummy dielectric layer 214 are removed from the channel regions 10C or 20C to expose the semiconductor layers 206 and sacrificial layers 208 in channel regions 10C or 20C.

Figure 15:
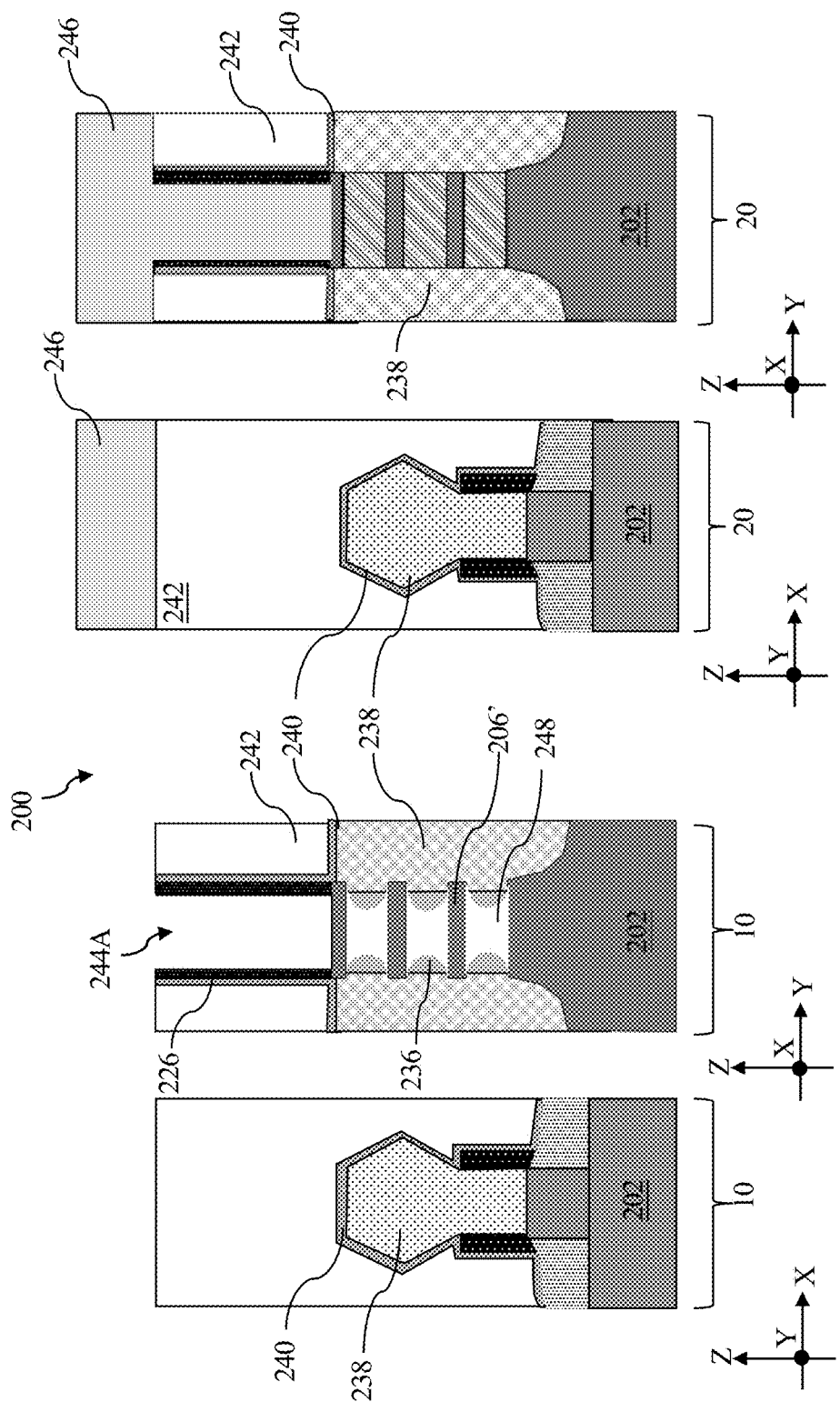

Referring to FIGS. 1 and 15, the method 100 includes a block 122 where the sacrificial layers 208 exposed in the first gate opening 244A are selectively removed such that semiconductor layers 206 in the channel region 10C are selectively released in the first device area 10 to become channel members. In some embodiments, the second device area 20 is masked by a second masking layer 246 that may be similar to the first masking layer 230. In the depicted embodiment, an etching process selectively etches the exposed sacrificial layers 208 with minimal or no etching of the semiconductor layers 206 and, in some embodiments, minimal or no etching of gate spacer layer 226, and the inner spacer features 236. Various etching parameters can be tuned to achieve selective etching of the sacrificial layers 208, such as etchant composition, etching temperature, etching solution concentration, etching time, etching pressure, source power, RF bias voltage, RF bias power, etchant flow rate, other suitable etching parameters, or combinations thereof. For example, an etchant is selected for the etching process that etches the material of the sacrificial layers 208 (in the depicted embodiment, silicon germanium) at a higher rate than the material of the semiconductor layers 206 (in the depicted embodiment, silicon). The etching process may be a dry etching process, a wet etching process, other suitable etching process, or combinations thereof. In some embodiments, a dry etching process (such as an RIE process) utilizes a fluorine-containing gas (for example, $SF_6$) to selectively etch the sacrificial layers 208. In some embodiments, a ratio of the fluorine-containing gas to an oxygen-containing gas (for example, $O_2$ or $O_3$), an etching temperature, and/or an RF power may be tuned to selectively etch silicon germanium or silicon. In some embodiments, a wet etching process utilizes an etching solution that includes ammonium hydroxide ($NH_4OH$) and water ($H_2O$) to selectively etch the sacrificial layers 208. In some embodiments, a chemical vapor phase etching process using hydrochloric acid (HCl) selectively etches the sacrificial layers 208. Upon conclusion of the operations at block 122, the semiconductor layers 206 in the channel regions 10C become suspended over space 248 left behind by removal of the sacrificial layers 208 in the first fin element 210A. The released semiconductor layers 206 in the channel regions 10C may be referred to as channel members 206'. The space 248 is in fluid communication with the first gate opening 244A. After the channel members 206' in the first device area 10 are released at block 122, the second masking layer 246 may be removed from the second device area 20 using etching, ashing, or a suitable method.

Figure 16:
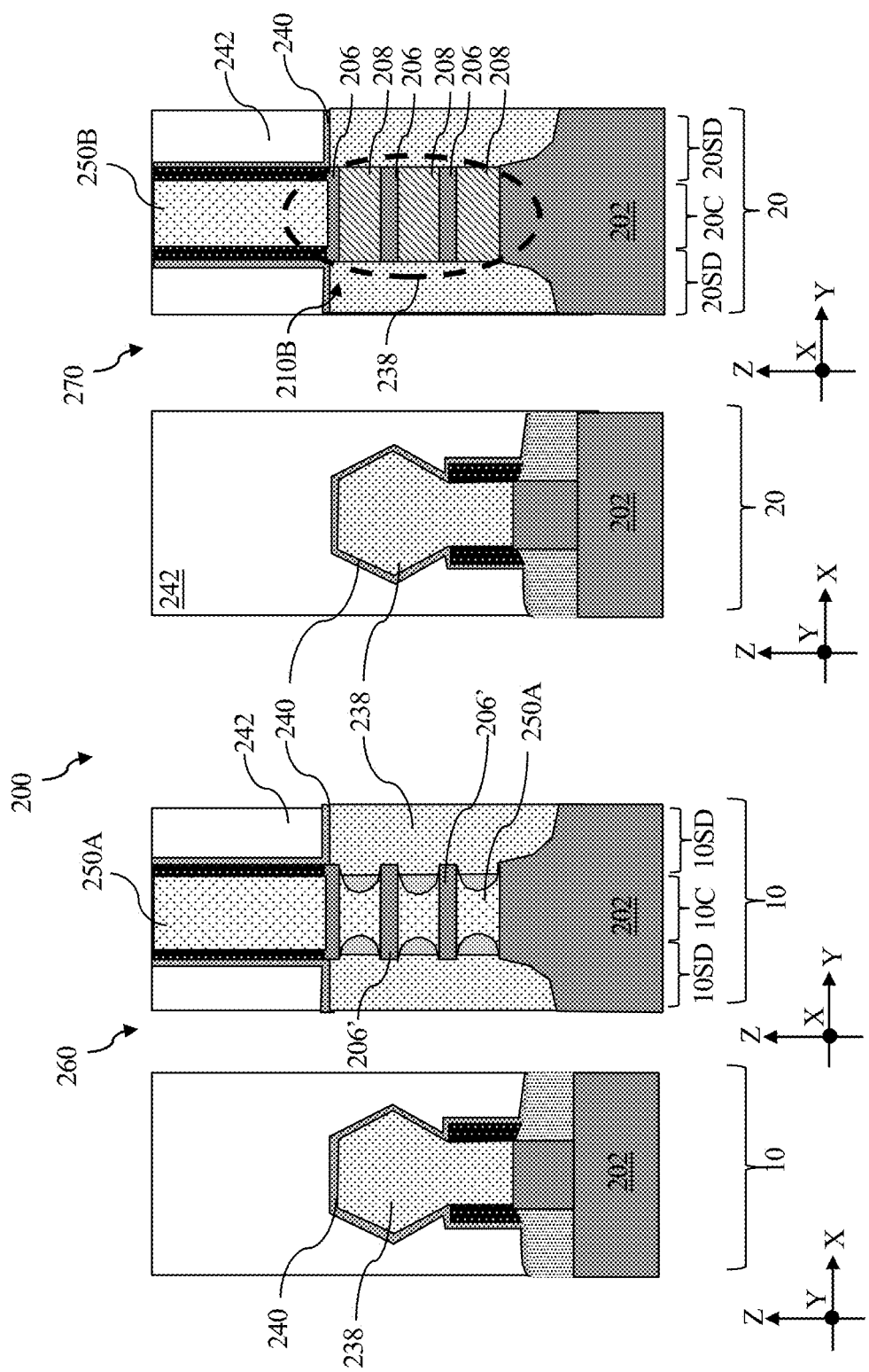

Referring to FIGS. 1 and 16, the method 100 includes a block 124 where a first gate structure 250A is formed over the channel region 10C in the first device area 10 and a second gate structure 250B is formed over the channel region 20C in the second device area 20. In some embodiments where the processes and compositions of the first gate structure 250A and the second gate structure 250B are substantially same, the formation of the first gate structure 250A and the second gate structure 250B may be performed simultaneously. In some alternative embodiments not specifically shown in figures of the present disclosure, the first gate structure 250A and the second gate structure 250B may be formed separately by selective masking using a masking layer. Each of the first gate structure 250A and the second gate structure 250B may include an interfacial layer, a gate dielectric layer, one or more work function layers, and a metal fill layer. An example process is described below. An interfacial layer may be formed on the channel members 206' in the channel region 10C in the first device area 10 and on the channel region 10C of the second fin element 210B in the second device area 20 to provide adhesion the subsequently formed gate dielectric layer. In some implementations, the interfacial layer may include a dielectric material such as silicon oxide, hafnium silicate, or silicon oxynitride. The interfacial layer may be formed by chemical oxidation, thermal oxidation, atomic layer deposition (ALD), chemical vapor deposition (CVD), and/or other suitable method. A gate dielectric layer is then deposited over channel members 206' in the channel region 10C in the first device area 10 and the channel region 10C of the second fin element 210B in the second device area 20. The gate dielectric layer may include one or more high-k dielectric materials. High-k dielectric materials, as used and described herein, include dielectric materials having a high dielectric constant, for example, greater than that of thermal silicon oxide (~3.9). Example high-K dielectric material may include $TiO_2$, HfZrO, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), other high-k dielectric material, or combinations thereof. The gate dielectric layer may be formed by ALD, physical vapor deposition (PVD), CVD, oxidation, and/or other suitable methods.

One or more work function layer may be then deposited over the gate dielectric layer. In some implementations, different work function layers may be formed in n-type device regions and p-type device regions. In those implementations, while n-type device regions and p-type device regions may share certain common work function layers, n-type device regions may include one or more work function layers that are not present in the p-type device regions.

Similarly, in alternative implementations, p-type device regions may include one or more work function layers that are not present in the n-type device regions. P-type work function layer includes any suitable p-type work function material, such as TiN, TaN, TaSN, Ru, Mo, Al, WN, WCN ZrSi$_2$, MoSi$_2$, TaSi$_2$, NiSi$_2$, other p-type work function material, or combinations thereof. N-type work function layer includes any suitable n-type work function material, such as Ti, Al, Ag, Mn, Zr, TiAl, TiAlC, TiAlSiC, TaC, TaCN, TaSiN, TaAl, TaAlC, TaSiAlC, TiAlN, other n-type work function material, or combinations thereof. It is noted that p-type work function layers are not limited to use in p-type device regions and n-type work function layers are not limited to use in n-type device regions. P-type work function layers and n-type work function layers may be applied in n-type device regions and p-type device regions to achieve desired threshold voltage. In some embodiments, the metal gate stack 244 may include one or more metal fill layer. For example, a CVD process or a PVD process deposits the one or more metal fill layer on n-type work function layer(s) and p-type work function layer(s), such that metal fill layer fills any remaining portion of first gate opening 244A (including space 248) and the second gate opening 244B. The metal fill layer may include a suitable conductive material, such as Al, W, and/or Cu. The metal fill layer may additionally or collectively include other metals, metal oxides, metal nitrides, other suitable materials, or combinations thereof.

Reference is still made to FIG. 16. Upon conclusion of the operations at block 124, a first transistor 260 is formed in the first device area 10 and a second transistor 270 is formed in the second device area 20. As shown in FIG. 16, the first gate structure 250A of the first transistor 260 is disposed over and wraps around each of the channel members 206' in the channel region 10C in the first device area 10. That is, the first transistor 260 in the first device area 10 is a gate-all-around (GAA) transistor 260. The second gate structure 250B of the second transistor 270 is disposed over the channel region 20C of the second fin element 210B. It is noted that the sacrificial layers 208 in the channel region 20C of the second fin element 210B are not removed and the semiconductor layers 206 in the channel region 20C are not released to form channel members. That is, the second transistor 270 in the second device area 20 is a FinFET 270 where the second gate structure 250B does not extend into the channel region 20C of the second fin element 210B. Due to the presence of the semiconductor layers 206 and the sacrificial layers 208 in the channel region 20C of the second fin element 210B, the FinFET 270 may be referred to as being layered or a layered FinFET. As shown in FIG. 16, the source/drain feature 238 in the first transistor 260 in the first device area 10 is in direct contact with sidewalls of the channel members 206' and the inner spacer features 236. The source/drain feature 238 in the second transistor 270 in the second device area 20 is in direct contact with sidewalls of the semiconductor layers 206 and the sacrificial layers 208.

Figure 17:
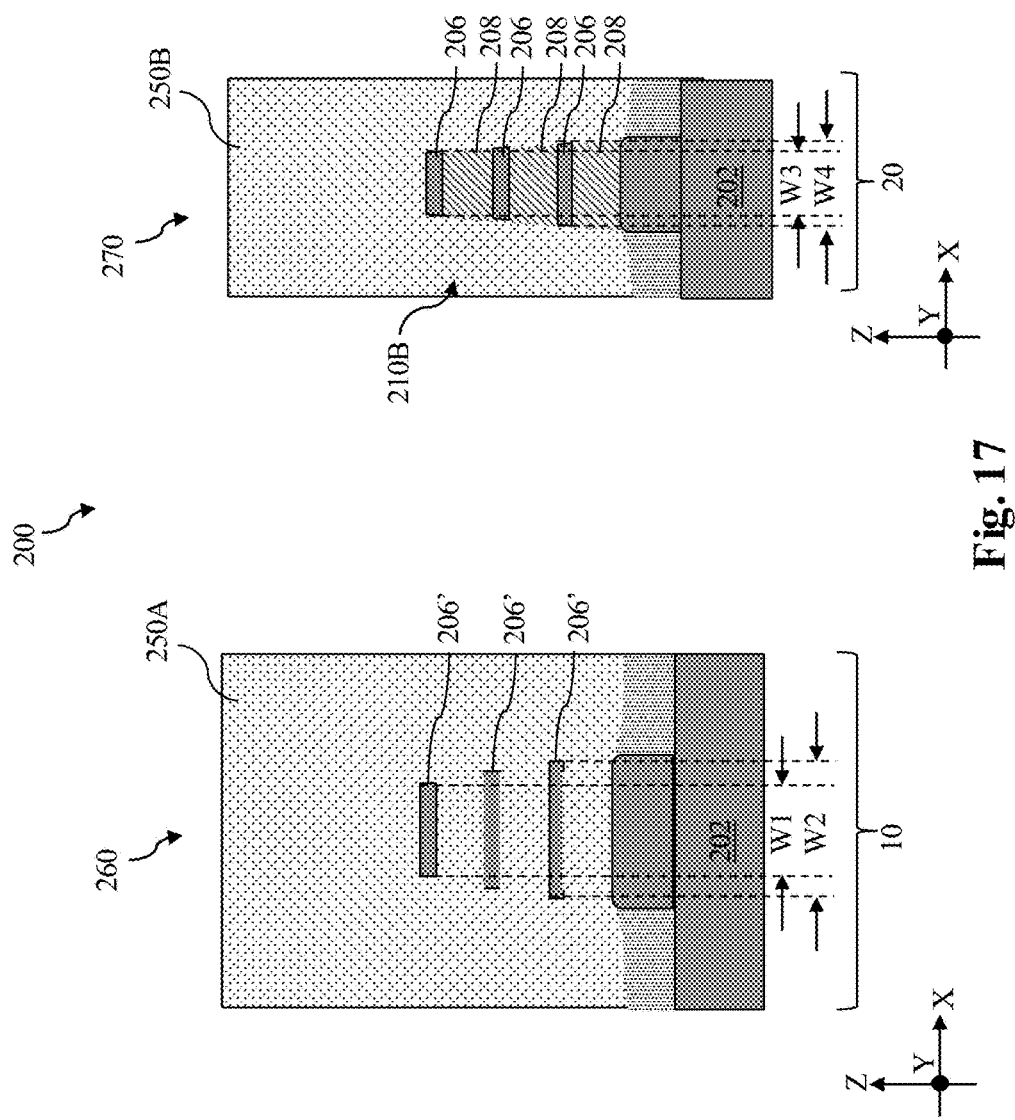

FIG. 17 illustrates cross-sectional views of the first transistor 260 and the second transistor 270 according to some alternative embodiments of the present disclosure. In some embodiments, sidewalls of the first fin element 210A and second fin element 210B shown in FIG. 3 may not be vertical. Instead, the sidewalls of the first fin element 210A and second fin element 210B may be tapered such that each of them has a wider bottom and a narrower top. The tapered sidewalls of the first fin element 210A and the second fin element 210B may be manifested in the first transistor 260 and the second transistor 270. With respect to the first transistor 260 illustrated in FIG. 17, when viewed along the lengthwise direction (Y direction) of the channel members 206', the topmost channel member 206' has a first width W1 and the bottommost channel member 206' has a second width W2 greater than the first width W1. With respect to the second transistor 270 in FIG. 17, when viewed along the lengthwise direction (Y direction) of the second fin element 210B, the second fin element 210B has a top surface with a third width W3 and a bottom surface with a fourth width W4. The fourth width W4 is greater than the third width W3. In some other embodiments, the first fin element 210A and the second fin element 210B may have different widths. For example, when a circuit design requires wider channel members to improve on-state current, the first fin element 210A may be wider than the second fin element 210B. The different fin element widths may be manifested in FIG. 17 as well. For example, the first width W1 may be greater than the third width W3 and the second width W2 may be greater than the fourth width W4.

Due to the capability of fabricating GAA transistors (such as the first transistor 260 in FIG. 16 or 17) in the first device area 10 and layered FinFET (such as the second transistor 270 in FIG. 16 or 17) in the second device area, methods of the present disclosure may be suitable for different applications. In one aspect, compared to the first transistor 260, the second transistor 270 includes a thicker channel region, making it suitable for high current applications. In some embodiments, the first device area 10 is a logic device area and the second device area 20 is an input/output (I/O) device area, wherein the layer FinFETs serve as I/O transistors. In another aspect, when the sacrificial layers 208 are formed of silicon germanium (SiGe), the sacrificial layers 208 in the channel region 20C may be strained by the semiconductor layers 206 when the semiconductor layers 206 is formed of silicon (Si). The strained sacrificial layers 208 in the second transistor 270 may become high hole mobility channel regions, suitable for p-type transistors. In some embodiments where a six-transistor (6T) static random access memory (SRAM) cell is desired, the first transistors 260 may serve as n-type pull-down (PD) transistors or n-type pass-gate (PG) transistors while the second transistor 270 formed using a method similar to method 100 may serve as p-type pull-up (PU) transistors. In yet another aspect, the first transistor 260 and the second transistor 270 formed using methods of the present disclosure may be used as two types of transistors of different threshold voltages. The first transistor 260 whose channel members 206' are formed from the semiconductor layers 206 may have a first threshold voltage (VT1) and the second transistor 270 whose channel region includes both semiconductor layers 206 and the sacrificial layers 208 may have a second threshold voltage (VT2) different from the first threshold voltage (VT1).

Referring to FIG. 1, the method 100 includes a block 126 where further processes are performed. Fabrication can proceed to continue fabrication of the semiconductor device 200. For example, various contacts can be formed to facilitate operation of the first transistor 260 and the second transistor 270 in the semiconductor device 200. For example, one or more ILD layers (similar to the ILD layer 242), and/or CESL layers (similar to the CESL 240) can be formed over substrate 202 (in particular, over ILD layer 242, first gate structure 250A and the second gate structure 250B). Contacts can then be formed in ILD layer 242 and/or ILD layers disposed over ILD layer 242. For example, contacts are respectively electrically and/or physically coupled with gate structures (including the first gate structure 250A and the second gate structure 250B) and contacts are respectively electrically and/or physically coupled to source/drain features 238. Contacts include a conductive material, such as aluminum, aluminum alloy (such as aluminum/silicon/copper alloy), copper, copper alloy, titanium, titanium nitride, tantalum, tantalum nitride, tungsten, polysilicon, metal silicide, other suitable metals, or combinations thereof. In some embodiments, a metal silicide layer may be formed at the interface between the source/drain features 238 and the source/drain contacts. The metal silicide may include nickel silicide, cobalt silicide, tungsten silicide, tantalum silicide, titanium silicide, platinum silicide, erbium silicide, palladium silicide, or combinations thereof. In some implementations, ILD layers disposed over ILD layer 242 and the contacts (for example, extending through ILD layer 242 and/or the other ILD layers) are a portion of a multilayer interconnect (MLI) structure.

In one exemplary aspect, the present disclosure is directed to a semiconductor device. The semiconductor device includes a first transistor in a first device area and a second transistor in a second device area. The first transistor includes a plurality of vertically stacked channel members, and a first gate structure over and around the plurality of vertically stacked channel members. The second transistor includes a fin-shaped channel member, and a second gate structure over the fin-shaped channel member. The fin-shaped channel member includes semiconductor layers interleaved by sacrificial layers. The semiconductor layers include a first semiconductor material and the sacrificial layers includes a second semiconductor material or a dielectric material. The first semiconductor material is different from the second semiconductor material. The plurality of vertically stacked channel members includes the first semiconductor material.

In some embodiments, the first semiconductor material includes silicon (Si), germanium (Ge), silicon germanium (SiGe), germanium tin (GeSn), silicon germanium tin (SiGeSn), gallium arsenide (GaAs), aluminum gallium arsenide (AlGaAs), or indium arsenide (InAs) and the second semiconductor material includes silicon (Si), germanium (Ge), silicon germanium (SiGe), germanium tin (GeSn), silicon germanium tin (SiGeSn). The dielectric material includes silicon oxide, silicon nitride, or silicon oxynitride. In some implementations, the first transistor includes a plurality of inner spacer features disposed between the plurality of vertically stacked channel members and the second gate structure does not extend into the fin-shaped channel member. In some instances, the first transistor further includes a first source/drain feature, the second transistor further includes a second source/drain feature, the first source/drain feature is in contact with the plurality of inner spacer features, and the first source/drain feature is in contact with the semiconductor layers and the sacrificial layers of the fin-shaped channel member. In some embodiments, the first device area is a logic device area and the second device area is an input/output device area. In some implementations, the first transistor includes a first threshold voltage and the second transistor includes a second threshold voltage different from the first threshold voltage. In some instances, the semiconductor device is a static random access memory (SRAM) cell. In some implementations, the first transistor serves as a pull-down transistor or a pass-gate transistor and the second transistor serves as a pull-up transistor.

In another exemplary aspect, the present disclosure is directed to a semiconductor device. The semiconductor device includes a fin-shaped channel member in a first area and a first gate structure over the fin-shaped channel member. The fin-shaped channel member includes a plurality of semiconductor layers interleaved by a plurality of sacrificial layers, each of the plurality of semiconductor layers includes a first semiconductor material, and each of the plurality of sacrificial layers includes a second semiconductor material or a dielectric material. The first semiconductor material is different from the second semiconductor material. In some implementations, the first semiconductor material includes silicon (Si), germanium (Ge), silicon germanium (SiGe), germanium tin (GeSn), silicon germanium tin (SiGeSn), gallium arsenide (GaAs), aluminum gallium arsenide (AlGaAs), or indium arsenide (InAs) and the second semiconductor material includes silicon (Si), germanium (Ge), silicon germanium (SiGe), germanium tin (GeSn), silicon germanium tin (SiGeSn). The dielectric material may include silicon oxide, silicon nitride, or silicon oxynitride. In some embodiments, the semiconductor device may further include a plurality of vertically stacked channel members in a second area different from the first area and a second gate structure over and around each of the plurality of vertically stacked channel members. The plurality of vertically stacked channel members includes the first semiconductor material. In some embodiments, the semiconductor device further includes a plurality of inner spacer features disposed between the plurality of vertically stacked channel members. The first gate structure does not extend into the fin-shaped channel member. In some implementations, the semiconductor device further includes a first source/drain feature in contact with the plurality of semiconductor layers and the plurality of sacrificial layers in the fin-shaped channel member and a second source/drain feature in contact with the plurality of vertically stacked channel members. The second source/drain feature is in contact with the plurality of inner spacer features.

In yet another exemplary aspect, the present disclosure is directed to a method. The method includes forming on a substrate a stack comprising a plurality of semiconductor layers interleaved by a plurality of sacrificial layers, forming a first fin element from the stack in a first area of the substrate and a second fin element from the stack in a second area of the substrate, forming a first dummy gate stack over the first fin element and a second dummy gate stack over the second fin element, depositing a gate spacer layer over the first dummy gate stack and the second dummy gate stack, forming a first source/drain recess in the first area and a second source/drain recess in the second area, selectively and partially etching the plurality of sacrificial layers in the first area to form a plurality of inner spacer recesses, forming a plurality of inner spacer features in the plurality of inner spacer recesses in the first area, and forming a first source/drain feature in the first source/drain recess and a second source/drain feature in the second source/drain recess.

In some embodiments, the plurality of the semiconductor layers include silicon (Si) and the plurality of sacrificial layers include silicon germanium (SiGe). In some implementations, the plurality of the semiconductor layers include a first semiconductor material, the plurality of sacrificial layers include a second semiconductor material or a dielectric material, and the first semiconductor material is different from the second semiconductor material. In some instances, the first semiconductor material includes silicon (Si), germanium (Ge), silicon germanium (SiGe), germanium tin (GeSn), silicon germanium tin (SiGeSn), gallium arsenide (GaAs), aluminum gallium arsenide (AlGaAs), or indium, arsenide (InAs), the second semiconductor material includes silicon (Si), germanium (Ge), silicon germanium (SiGe), germanium tin (GeSn), silicon germanium tin (SiGeSn), and the dielectric material includes silicon oxide, silicon nitride, or silicon oxynitride. In some implementations, the forming of the plurality of inner spacer features includes blanketly depositing an inner spacer layer over the first fin element, the first dummy gate stack, the second fin element, and the second dummy gate stack, and etching back the inner spacer layer to expose the gate spacer layer while the plurality of inner spacer features are disposed in the plurality of inner spacer recesses. In some embodiments, the method may further include depositing a dielectric layer over the first area and the second area, planarizing the dielectric layer to expose the first dummy gate stack and the second dummy gate stack, removing the first dummy gate stack and the second dummy gate stack to form a first trench and a second trench, respectively, selectively removing the plurality of sacrificial layers exposed in the first trench while the second trench is masked, thereby releasing a plurality of vertically stacked channel members, and simultaneously forming a first gate structure over and around the plurality of vertically stacked channel members and a second gate structure in the second trench. In some instances, the simultaneously forming of the first gate structure and the second gate structure includes forming an interfacial layer, forming a gate dielectric layer over the interfacial layer, depositing a work function layer over the gate dielectric layer, and depositing a metal fill layer over the work function layer.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a first transistor in a first device area, the first transistor comprising:
      a plurality of vertically stacked channel members,
      a plurality of dielectric inner spacer features interleaving the plurality of vertically stacked channel members, and
      a first gate structure wrapping around each of the plurality of vertically stacked channel members; and
   a second transistor in a second device area, the second transistor comprising:
      a fin-shaped channel member, and
      a second gate structure over the fin-shaped channel member,
   wherein the fin-shaped channel member comprises semiconductor layers interleaved by sacrificial layers,
   wherein the second gate structure does not extend into the fin-shaped channel member,
   wherein the semiconductor layers comprise a first semiconductor material and the sacrificial layers comprise a second semiconductor material,
   wherein the first semiconductor material is different from the second semiconductor material,
   wherein the plurality of vertically stacked channel members comprises the first semiconductor material.

2. The semiconductor device of claim 1,
   wherein the first semiconductor material comprises silicon (Si), germanium (Ge), silicon germanium (SiGe), germanium tin (GeSn), silicon germanium tin (SiGeSn), gallium arsenide (GaAs), aluminum gallium arsenide (AlGaAs), or indium arsenide (InAs),
   wherein the second semiconductor material comprises silicon (Si), germanium (Ge), silicon germanium (SiGe), germanium tin (GeSn), silicon germanium tin (SiGeSn).

3. The semiconductor device of claim 1,
   wherein the first transistor comprises a plurality of inner spacer features disposed between the plurality of vertically stacked channel members,
   wherein the second gate structure does not extend into the fin-shaped channel member.

4. The semiconductor device of claim 3,
   wherein the first transistor further comprises a first source/drain feature,
   wherein the second transistor further comprises a second source/drain feature,
   wherein the first source/drain feature is in contact with the plurality of inner spacer features,
   wherein the first source/drain feature is in contact with the semiconductor layers and the sacrificial layers of the fin-shaped channel member.

5. The semiconductor device of claim 1, wherein the first device area is a logic device area and the second device area is an input/output device area.

6. The semiconductor device of claim 1,
   wherein the first transistor comprises a first threshold voltage,
   wherein the second transistor comprises a second threshold voltage different from the first threshold voltage.

7. The semiconductor device of claim 1 is a static random access memory (SRAM) cell.

8. The semiconductor device of claim 7,
   wherein the first transistor serves as a pull-down transistor or a pass-gate transistor,
   wherein the second transistor serves as a pull-up transistor.

9. A semiconductor device, comprising:
   a fin-shaped channel member in a first area, the fin-shaped channel member extending along a direction;
   a first gate structure directly over the fin-shaped channel member; and
   a first source/drain feature,
   wherein the fin-shaped channel member comprises a plurality of semiconductor layers interleaved by a plurality of sacrificial layers,
   wherein the first source/drain feature directly contacts each of the plurality of semiconductor layers and each of the plurality of sacrificial layers along the direction,
   wherein each of the plurality of semiconductor layers comprises a first semiconductor material and each of the plurality of sacrificial layers comprises a second semiconductor material,
   wherein the first semiconductor material is different from the second semiconductor material, wherein the first gate structure is in direct contact with sidewalls of the plurality of semiconductor layers and sidewalls of the plurality of sacrificial layers such that the first gate structure does not extend between two adjacent one of the plurality of semiconductor layers.

10. The semiconductor device of claim 9,
wherein the first semiconductor material comprises silicon (Si), germanium (Ge), silicon germanium (SiGe), germanium tin (GeSn), silicon germanium tin (SiGeSn), gallium arsenide (GaAs), aluminum gallium arsenide (AlGaAs), or indium arsenide (InAs),
wherein the second semiconductor material comprises silicon (Si), germanium (Ge), silicon germanium (SiGe), germanium tin (GeSn), silicon germanium tin (SiGeSn).

11. The semiconductor device of claim 9, further comprising:
a plurality of vertically stacked channel members in a second area different from the first area; and
a second gate structure over and around each of the plurality of vertically stacked channel members,
wherein the plurality of vertically stacked channel members comprises the first semiconductor material.

12. The semiconductor device of claim 11, further comprising:
a plurality of inner spacer features disposed between the plurality of vertically stacked channel members,
wherein the first gate structure does not extend into the fin-shaped channel member.

13. The semiconductor device of claim 12, further comprising:
a second source/drain feature in contact with the plurality of vertically stacked channel members,
wherein the second source/drain feature is in contact with the plurality of inner spacer features.

14. A semiconductor structure, comprising:
a first transistor comprising:
a plurality of vertically stacked nanostructures, and
a first gate structure wrapping around each of the plurality of vertically stacked nanostructures; and a second transistor comprising:
a fin-shaped structure, and
a second gate structure over the fin-shaped structure,
wherein the fin-shaped structure comprises first semiconductor layers interleaved by second semiconductor layers,
wherein the second gate structure does not extend between any two of the first semiconductor layers and the second semiconductor layers,
wherein a composition of the plurality of vertically stacked nanostructures is the same as a composition of the first semiconductor layers.

15. The semiconductor structure of claim 14, wherein a composition of the second semiconductor layers is different from the composition of the first semiconductor layers.

16. The semiconductor structure of claim 14,
wherein the first transistor comprises a plurality of inner spacer features disposed between the plurality of vertically stacked nanostructures,
wherein the plurality of inner spacer features comprise aluminum oxide, zirconium oxide, tantalum oxide, yttrium oxide, titanium oxide, lanthanum oxide, silicon oxide, silicon carbonitride, silicon oxycarbonitride, silicon oxycarbide, or a combination thereof.

17. The semiconductor structure of claim 14, the second gate structure is in direct contact with sidewalls of the first semiconductor layers and the second semiconductor layers.

18. The semiconductor structure of claim 14,
wherein the plurality of vertically stacked nanostructures comprise a top nanostructure and a bottom nanostructure,
wherein the top nanostructure comprises a first width and the bottom nanostructure comprises a second width greater than the first width.

19. The semiconductor structure of claim 18, wherein the fin-shaped structure comprise a top width and a bottom width greater than the top width.

20. The semiconductor structure of claim 19,
wherein the first width is greater than the top width of the fin-shaped structure,
wherein the second width is greater than the bottom width of the fin-shaped structure.

* * * * *